US012615866B2

(12) United States Patent
Wang et al.

(10) Patent No.: US 12,615,866 B2
(45) Date of Patent: Apr. 28, 2026

(54) OPTICAL DEVICE

(71) Applicant: VisEra Technologies Company Ltd., Hsin-Chu City (TW)

(72) Inventors: Chun-Yuan Wang, Hsin-Chu City (TW); Po-Hsiang Wang, Hsin-Chu City (TW); Han-Lin Wu, Hsin-Chu City (TW); Hung-Jen Tsai, Hsin-Chu City (TW)

(73) Assignee: VISERA TECHNOLOGIES COMPANY LTD., Hsin-Chu City (TW)

( * ) Notice: Subject to any disclaimer, the term of this patent is extended or adjusted under 35 U.S.C. 154(b) by 732 days.

(21) Appl. No.: 18/064,296

(22) Filed: Dec. 12, 2022

(65) Prior Publication Data

US 2024/0194711 A1 Jun. 13, 2024

(51) Int. Cl.
*H10F 39/00* (2025.01)
*G02B 1/00* (2006.01)

(52) U.S. Cl.
CPC ......... *H10F 39/8053* (2025.01); *G02B 1/002* (2013.01)

(58) Field of Classification Search
CPC .... G02B 1/002; G02B 5/1809; G02B 5/1814; G02B 5/1819; G02B 5/1823; G02B 5/1871; G02B 5/20; H10F 39/12; H10F 39/8053; H10F 39/806; H10F 39/182
See application file for complete search history.

(56) References Cited

U.S. PATENT DOCUMENTS

| | | | |
|---|---|---|---|
| 2015/0214262 A1* | 7/2015 | Kim | H10F 39/8063 |
| | | | 438/70 |
| 2021/0112201 A1 | 4/2021 | Cho et al. | |
| 2021/0118932 A1 | 4/2021 | Cho et al. | |
| 2021/0271000 A1* | 9/2021 | Park | G02B 5/1871 |
| 2023/0154958 A1* | 5/2023 | Kim | H10F 39/024 |
| | | | 257/432 |
| 2023/0170365 A1* | 6/2023 | Lee | H10F 39/8057 |
| | | | 250/208.1 |
| 2023/0236339 A1* | 7/2023 | Park | G02B 1/002 |
| | | | 359/558 |

(Continued)

FOREIGN PATENT DOCUMENTS

| | | |
|---|---|---|
| CN | 115411059 A | 11/2022 |
| KR | 20150143148 A | 12/2015 |

(Continued)

*Primary Examiner* — Nicholas R. Pasko
(74) *Attorney, Agent, or Firm* — LIU & LIU

(57) ABSTRACT

An optical device includes a photoelectric conversion layer, an anti-reflection layer, an underlying layer, a bottom meta layer, and a top meta layer. The photoelectric conversion layer includes a plurality of photodiodes. The anti-reflection layer is disposed on the photoelectric conversion layer. The underlying layer is disposed on the anti-reflection layer. The bottom meta layer is disposed on the underlying layer and includes a plurality of bottom meta units and a filling between the bottom meta units, in which the filling is continuously extend from the underlying layer, and a material of the filling is the same as a material of the underlying layer. The top meta layer is disposed above the bottom meta layer and includes a plurality of top meta units and a plurality of air recesses, in which the plurality of air recesses are respectively disposed between two adjacent top meta units.

18 Claims, 15 Drawing Sheets

(56)     References Cited

U.S. PATENT DOCUMENTS

| | | | | |
|---|---|---|---|---|
| 2024/0079421 | A1* | 3/2024 | Crocherie | ............... H10F 39/18 |
| 2024/0322056 | A1* | 9/2024 | Kuo | .................... H10F 39/8067 |
| 2025/0072146 | A1* | 2/2025 | Ogasahara | ............ H10F 39/806 |

FOREIGN PATENT DOCUMENTS

| | | | |
|---|---|---|---|
| KR | 20170070685 | A | 6/2017 |
| KR | 20210048951 | A | 5/2021 |
| TW | 202011594 | A | 3/2020 |
| TW | 202221363 | A | 6/2022 |
| TW | 202247481 | A | 12/2022 |
| WO | 2018230186 | A | 12/2018 |
| WO | 2019124562 | A | 6/2019 |
| WO | 2021136469 | A | 7/2021 |
| WO | 2022104629 | A | 5/2022 |

* cited by examiner

600

OPTICAL DEVICE

BACKGROUND

Field of Invention

The present disclosure relates to an optical device. More particularly, the present disclosure relates to the optical device with multilayer meta-surfaces.

Description of Related Art

Accompanying with the development of semiconductor devices, the techniques of complementary metal oxide semiconductor (CMOS) image sensors (also known as CIS) with smaller dimensions are highly demanded. In CIS, the arrangements and dimensions of elements in an optical device would affect the focal length of light. The focal length of light would further affect the thicknesses of elements. In addition, different regions of light also suitable for different types of optical devices. Therefore, there is a need for an optical device with smaller thickness to reduce the focal length of light.

SUMMARY

One aspect of the present disclosure is to provide an optical device. The optical device includes a photoelectric conversion layer, an anti-reflection layer, an underlying layer, a bottom meta layer, and a top meta layer. The photoelectric conversion layer includes a plurality of photodiodes. The anti-reflection layer is disposed on the photoelectric conversion layer. The underlying layer is disposed on the anti-reflection layer. The bottom meta layer is disposed on the underlying layer and including a plurality of bottom meta units and a filling between the bottom meta units, in which the filling continuously extends from the underlying layer, and a material of the filling is the same as a material of the underlying layer. The top meta layer is disposed above the bottom meta layer and includes a plurality of top meta units and a plurality of air recesses, in which the plurality of air recesses are respectively disposed between two adjacent top meta units.

In some embodiments, a height of the underlying layer from bottom surfaces of the bottom meta units to a top surface of the anti-reflection layer is based on the following equations:

$$h \leq ht - p$$

$$ht = \frac{np^2}{\lambda_0} - \frac{\lambda_0}{4n}$$

wherein h is the height of the underlying layer from bottom surfaces of the bottom meta units to a top surface of the anti-reflection layer, ht is a theoretical height of the underlying layer, p is a pixel dimension, wherein the pixel dimension is determined by a distance between two adjacent deep trench isolations, n is a refractive index of the underlying layer, and $\lambda_0$ is a center wavelength of a designed wavelength band of a light passing through the top meta layer and the bottom meta layer.

In some embodiments, the optical device further includes a color filter layer disposed between the anti-reflection layer and the underlying layer. The color filter layer includes a plurality of color filters and each of the color filters corresponds to one or dual photodiodes, and the height of the underlying layer is from bottom surfaces of the bottom meta units to a top surface of the color filter layer.

In some embodiments, the color filter layer includes a first color filter, a second color filter, and a third color filter. The plurality of bottom meta units are disposed above the first color filter and the second color filter and free of disposed above the third color filter.

In some embodiments, an effective index of the top meta layer is in a range from 1.3 to 1.6, a refractive index of the bottom meta units is in a range from 1.4 to 2.6, a refractive index of the underlying layer is in a range from 1.2 to 1.8, and the refractive index of the bottom meta units is greater than the refractive index of the underlying layer.

In some embodiments, the top meta layer in the optical device further includes a capping layer conformally and continuously lining the plurality of top meta units and the plurality of air recesses, wherein the plurality of air recesses are remained in the top meta layer.

In some embodiments, a refractive index of the top meta units is in a range from 1.4 to 2.6, a refractive index of the capping layer is in a range from 1.4 to 1.6, and the refractive index of the top meta units is different from the refractive index of the capping layer.

In some embodiments, the top meta layer has a global shift relative to the bottom meta layer.

In some embodiments, the top meta units of the top meta layer have an inner shift, and the inner shift includes a negative shift and a positive shift.

In some embodiments, the optical device further includes a middle meta layer disposed between the top meta layer and the bottom meta layer, wherein the middle meta layer includes a plurality of middle meta units and arranged in a first layer and a second layer, the first layer connects to the top meta units, the second layer connects to the bottom meta layer, and the first layer and the second layer are spaced by the underlying layer.

In some embodiments, the optical device further includes a color filter layer and an internal space layer, wherein the color filter layer is disposed between the photoelectric conversion layer and the underlying layer, and the internal space layer is continuously disposed between the plurality of bottom meta units and the plurality of top meta units.

In some embodiments, the color filter layer includes a plurality of color filters and each of the color filters corresponds to quad photodiodes, and a height of the underlying layer from bottom surfaces of the bottom meta units to a top surface of the color filter layer is based on the following equations:

$$h \leq ht - 2p$$

$$ht = \frac{4np^2}{\lambda_0} - \frac{\lambda_0}{4n}$$

wherein h is the height of the underlying layer from bottom surfaces of the bottom meta units to a top surface of the color filter layer, ht is a theoretical height of the underlying layer, p is a pixel dimension, wherein the pixel dimension is determined by a distance between two adjacent deep trench isolations, n is a refractive index of the underlying layer, and $\lambda_0$ is a center wavelength of a designed wavelength band of a light passing through the top meta layer and the bottom meta layer.

In some embodiments, the color filter layer includes a first color filter, a second color filter, and a third color filter. The plurality of bottom meta units are disposed above the first color filter, the second color filter, and the third color filter. The plurality of top meta units are disposed above the first color filter and the second color filter and free of disposed above the third color filter.

In some embodiments, the color filter layer includes a first color filter and a second color filter, the photodiodes below the first color filter extend along a first direction and arranges along a second direction substantially perpendicular to the first direction, and the photodiodes below the second color filter extend along the second direction and arrange along the first direction.

In some embodiments, a symmetry axis of each of the bottom meta units is misaligned with a symmetry axis of each of the top meta units.

In some embodiments, the bottom meta units are arranged in one layer, and the bottom meta units connect to the top meta units.

In some embodiments, a refractive index of the bottom meta units is in a range from 1.4 to 2.6, a refractive index of the top meta units is in a range from 1.4 to 2.6, and the refractive index of the bottom meta units is the same as the refractive index of the top meta units.

In some embodiments, a refractive index of the internal space layer is the same as the refractive index of the bottom meta units or the refractive index of the top meta units.

In some embodiments, a refractive index of the internal space layer is different from the refractive index of the bottom meta units and the refractive index of the top meta units.

In some embodiments, a width of each of the bottom meta units is in a range from 70 nm to 500 nm, a width of each of the top meta units is in a range from 70 nm to 500 nm, a height of each of the bottom meta units is in a range from 50 nm to 500 nm, a height of each of the top meta units is in a range from 50 nm to 500 nm, and a height of the internal space layer is in a range from 0 to 500 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

4

Figure 9:
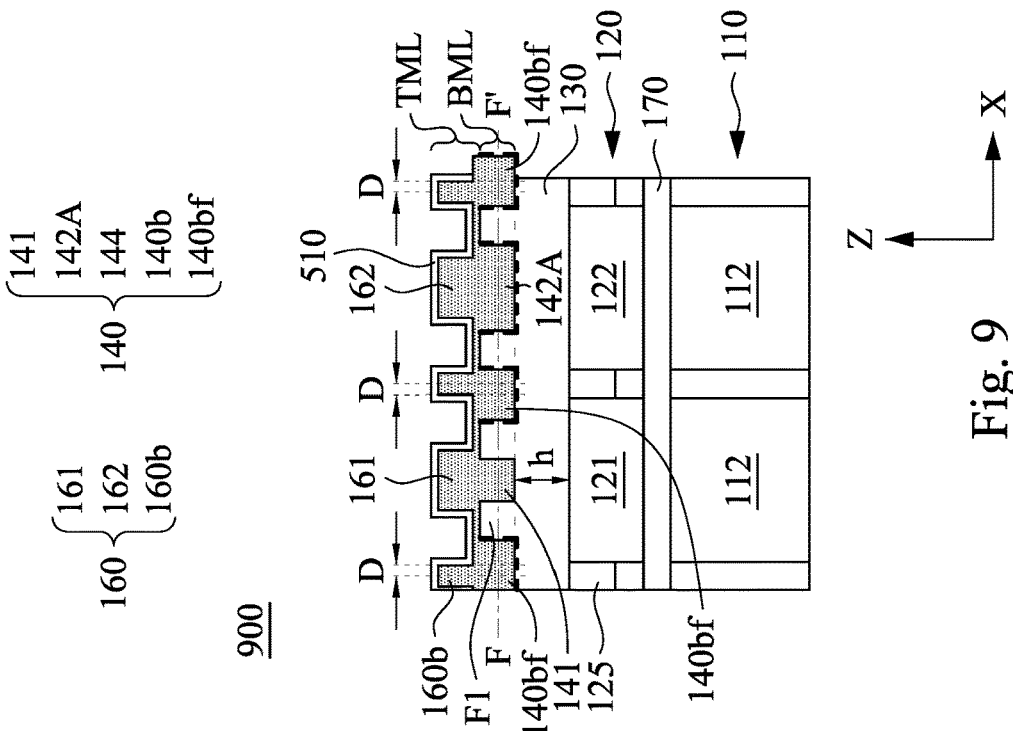

FIG. 9 is a cross-sectional view of an optical device in accordance with one embodiment of the present disclosure.

Figure 10:
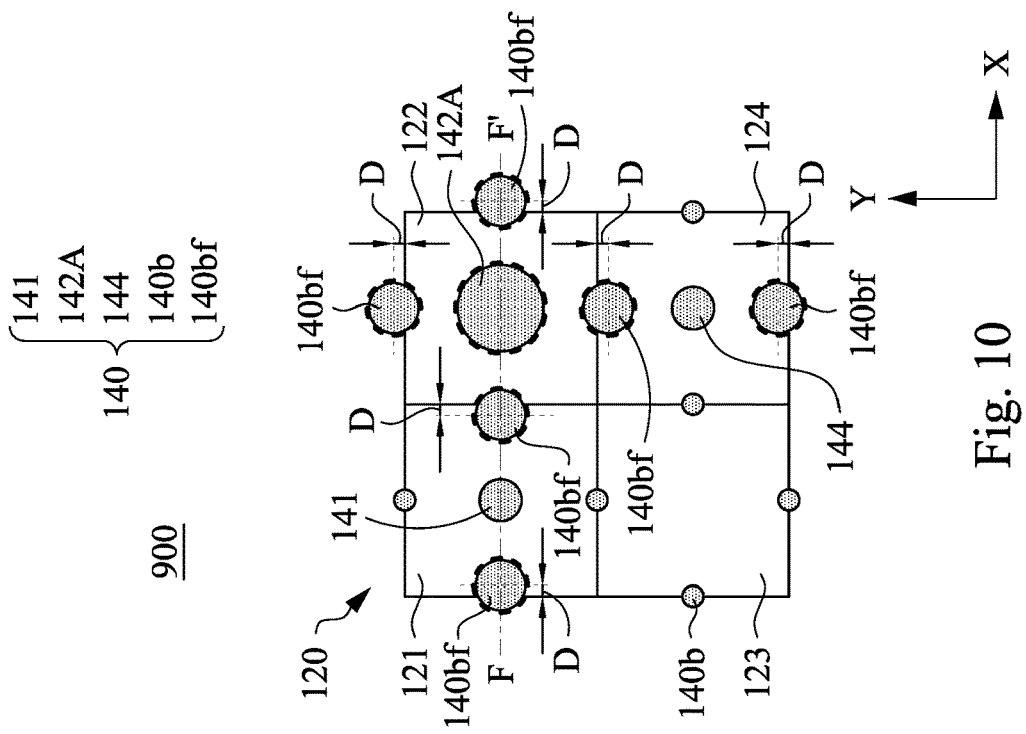

FIG. 10 is a top view of the color filter layer and bottom meta units of the optical device in FIG. 9.

Figure 11:
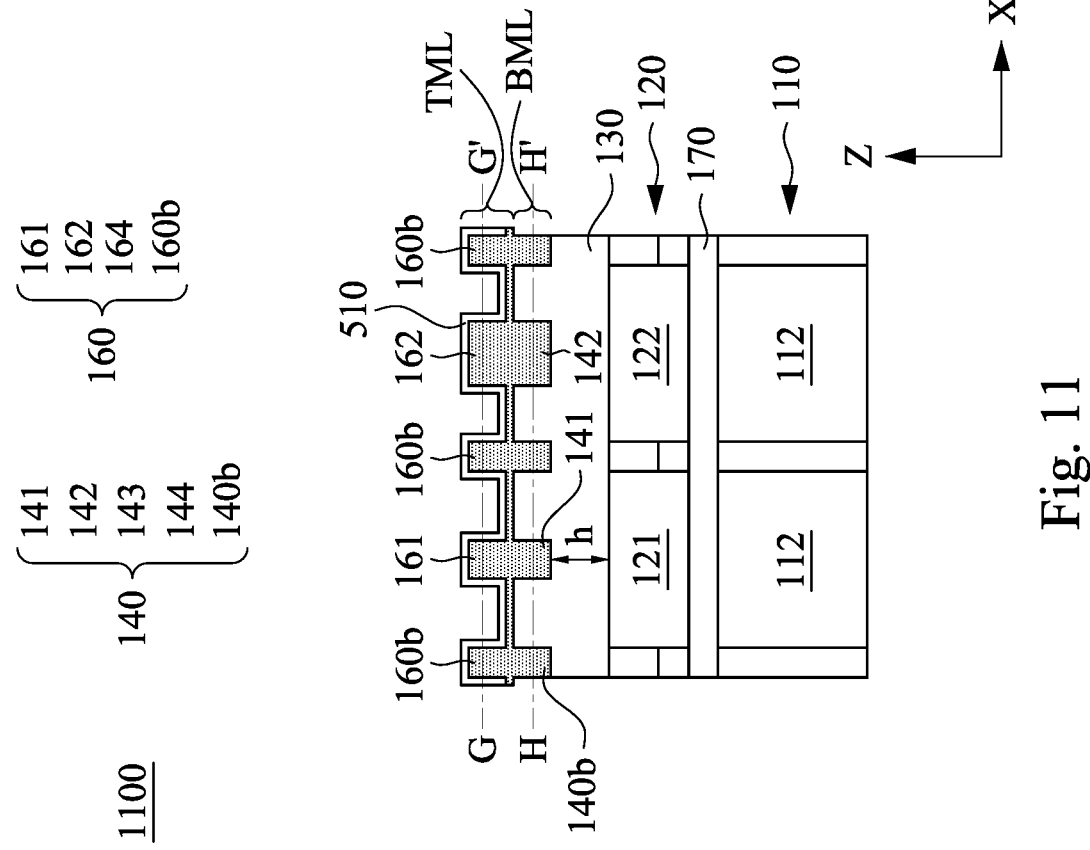

FIG. 11 is a cross-sectional view of an optical device in accordance with one embodiment of the present disclosure.

Figure 12:
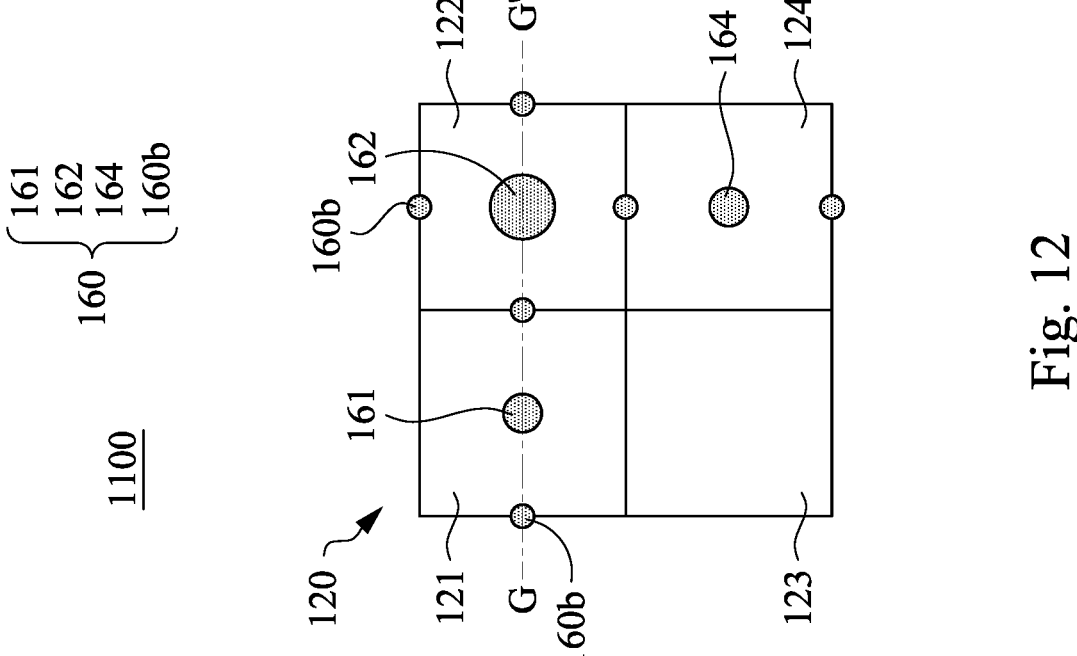

FIG. 12 is a top view of a color filter layer and top meta units of the optical device in FIG. 11.

Figure 13:
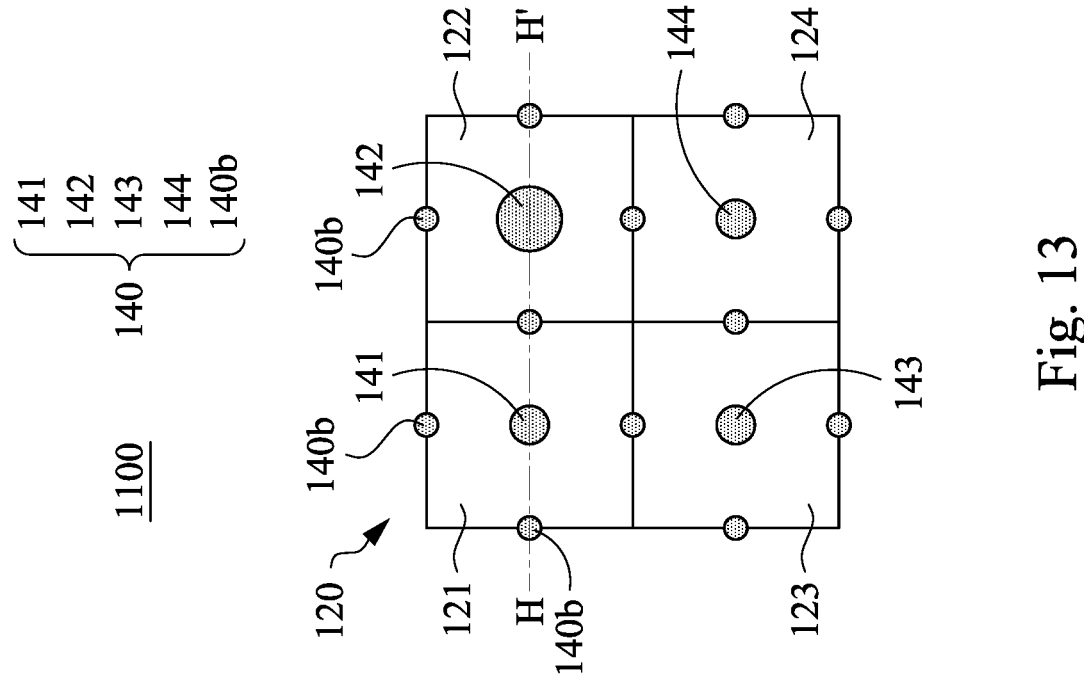

FIG. 13 is a top view of a color filter layer and bottom meta units of the optical device in FIG. 11.

Figure 14B:
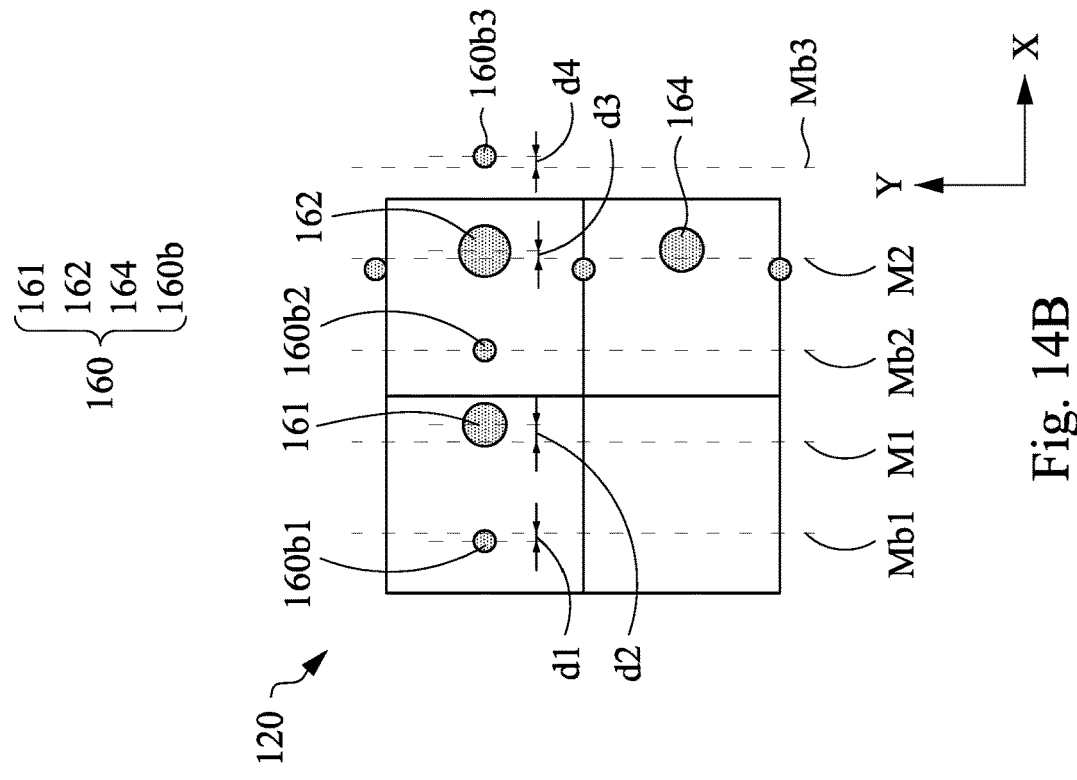
Figure 14A:
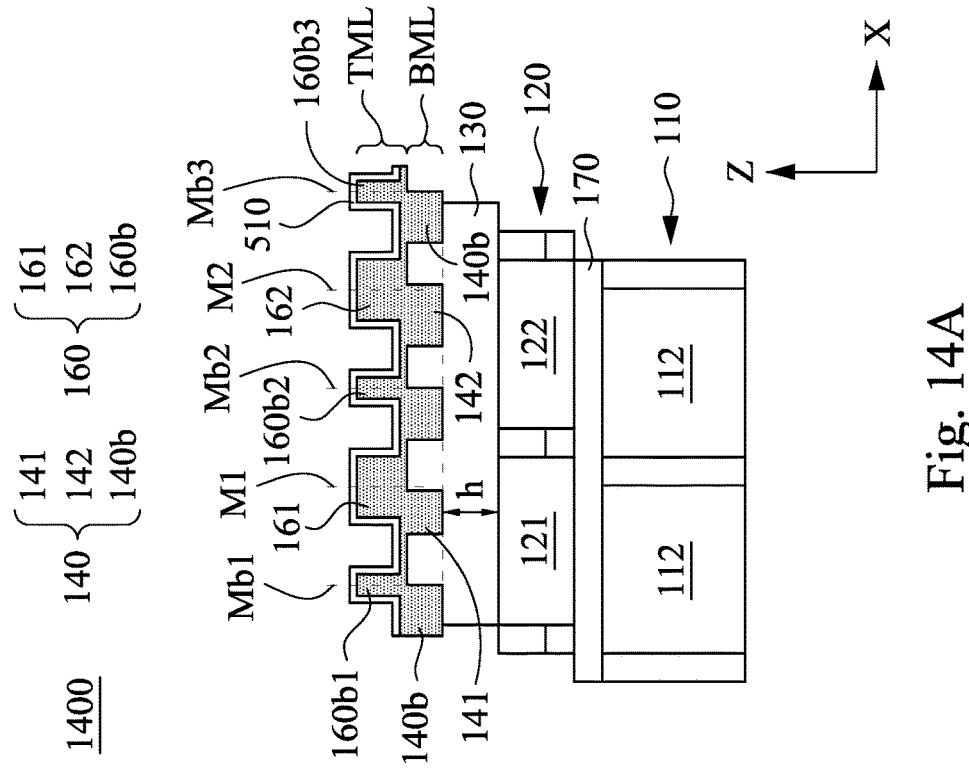

FIG. 14A is a cross-sectional view of an optical device in accordance with one embodiment of the present disclosure.

FIG. 14B is a top view of a color filter layer and top meta units in accordance with an alternative embodiment of the optical device in FIG. 14A.

Figure 15:
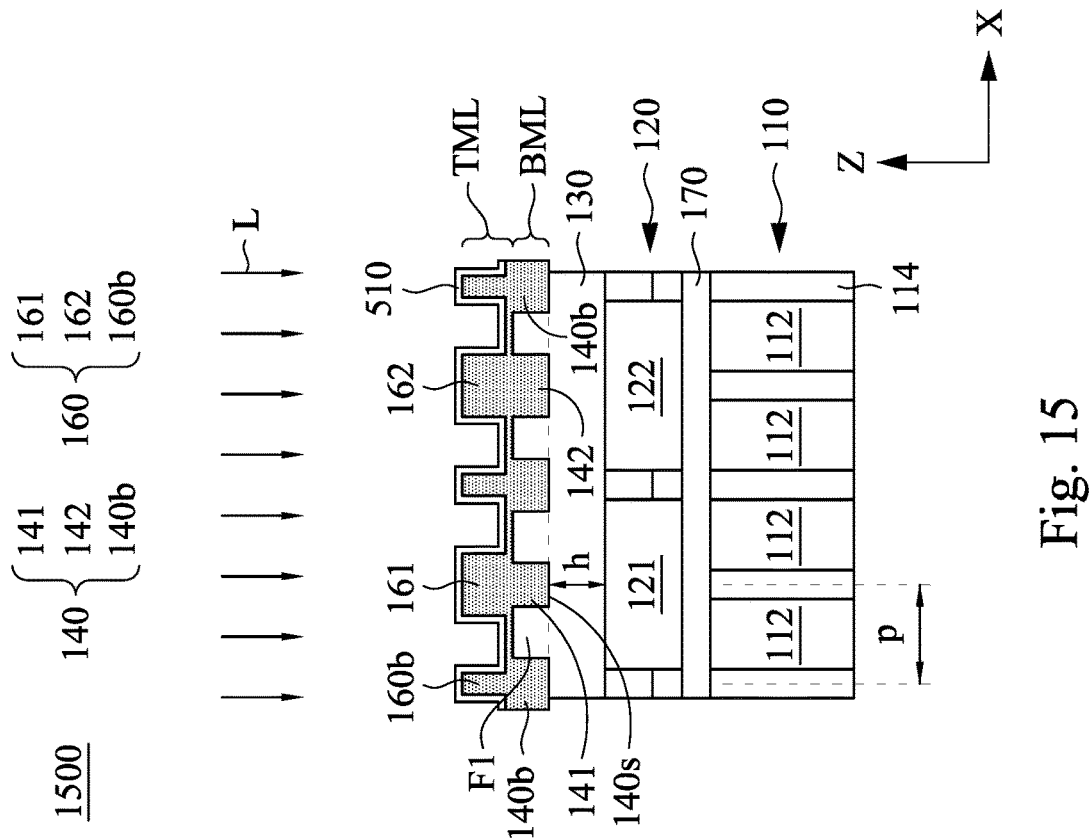

FIG. 15 is a cross-sectional view of an optical device in accordance with one embodiment of the present disclosure.

Figure 16:
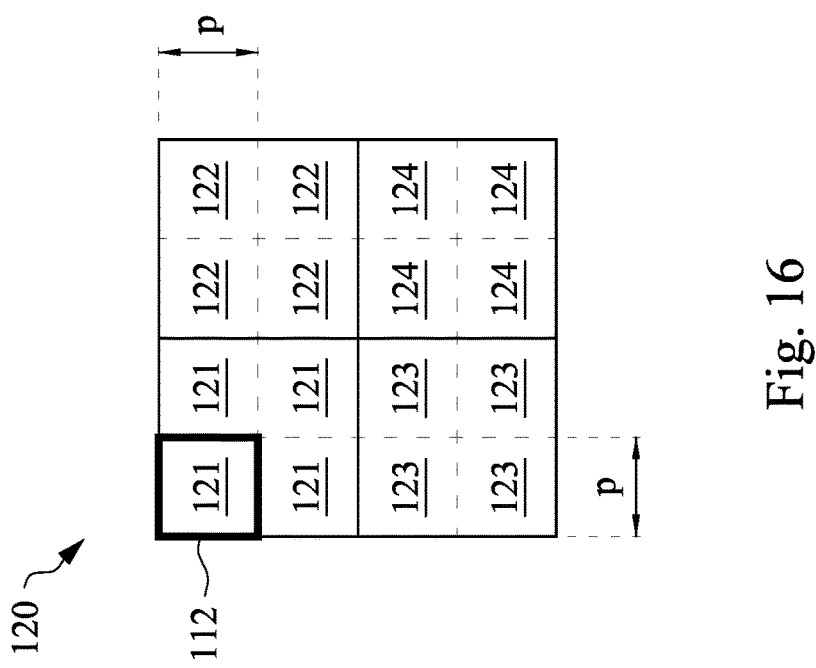

FIG. 16 is a top view of a color filter layer of the optical device in FIG. 15.

Figures 17A, 17B, 17C:

FIG. 17A and FIG. 17B are cross-sectional views of optical devices in accordance with some embodiments of the present disclosure.

FIG. 17C is a top view of color filter layers of the optical devices in FIG. 17A and FIG. 17B.

Figure 18A:
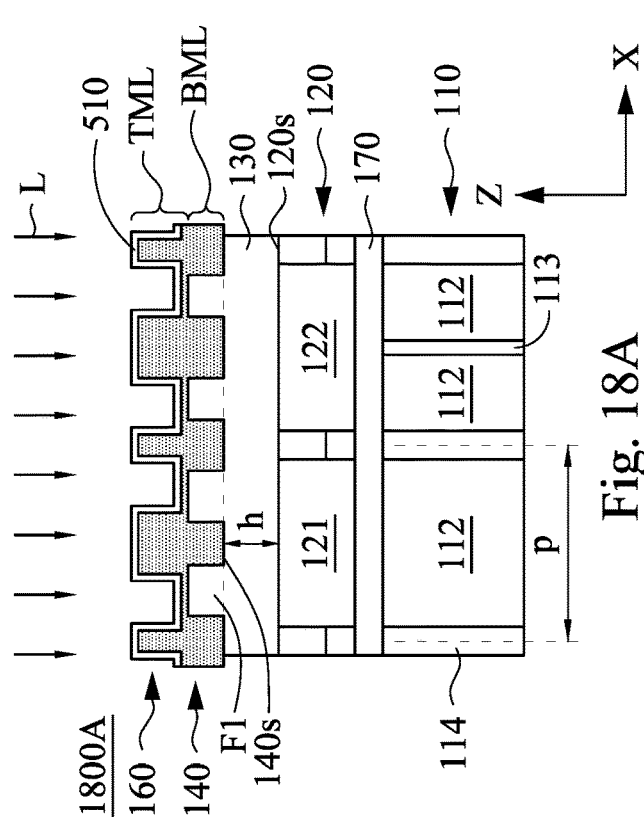
Figure 18B:
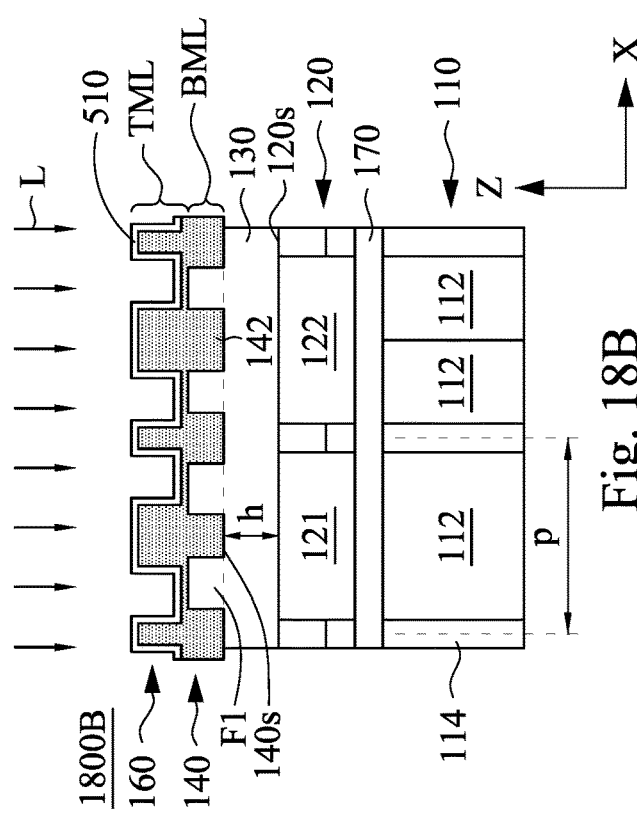

FIG. 18A and FIG. 18B are cross-sectional views of optical devices in accordance with some embodiments of the present disclosure.

Figure 18C:
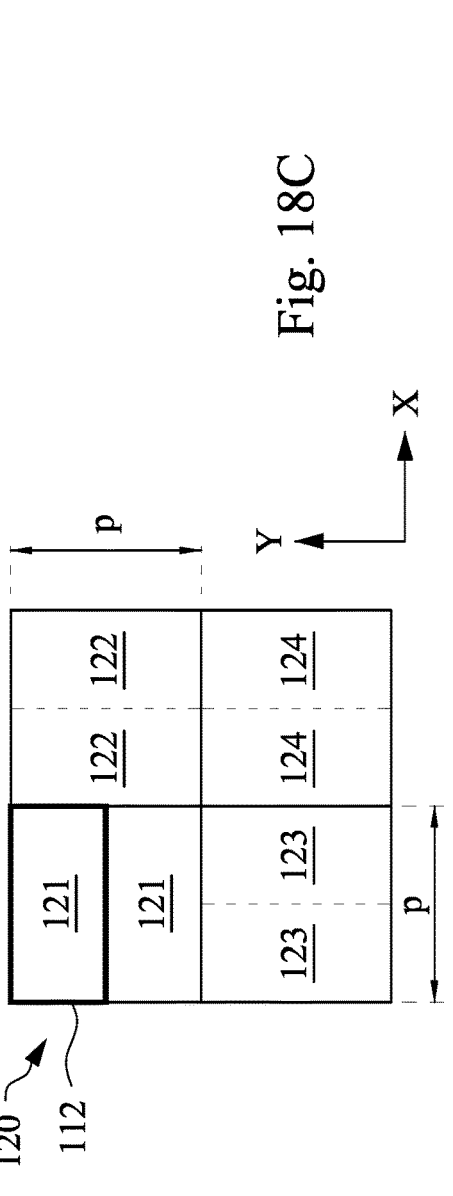

FIG. 18C is a top view of color filter layers of the optical devices in FIG. 18A and FIG. 18B.

Figure 19:
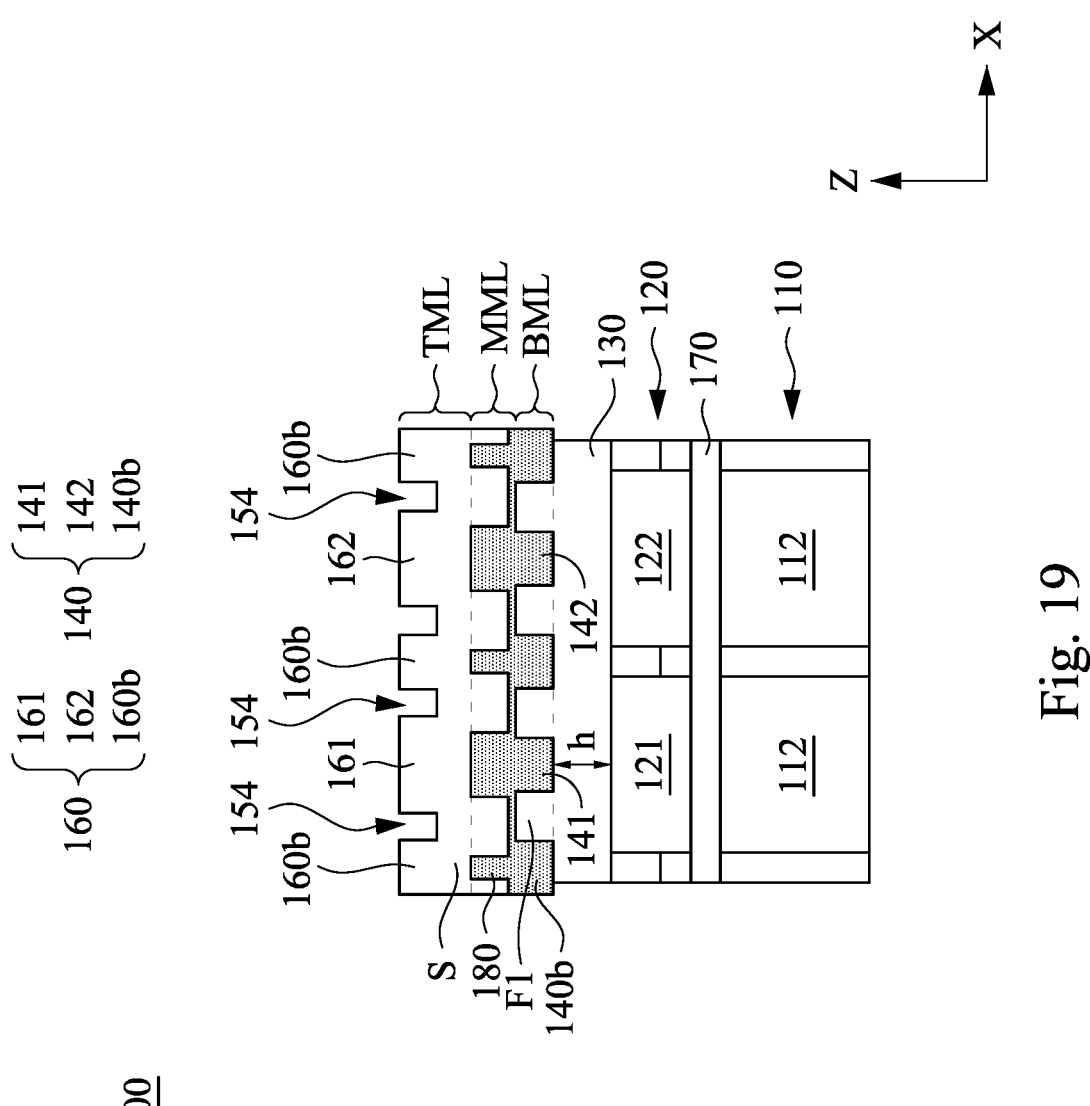
Figure 21:
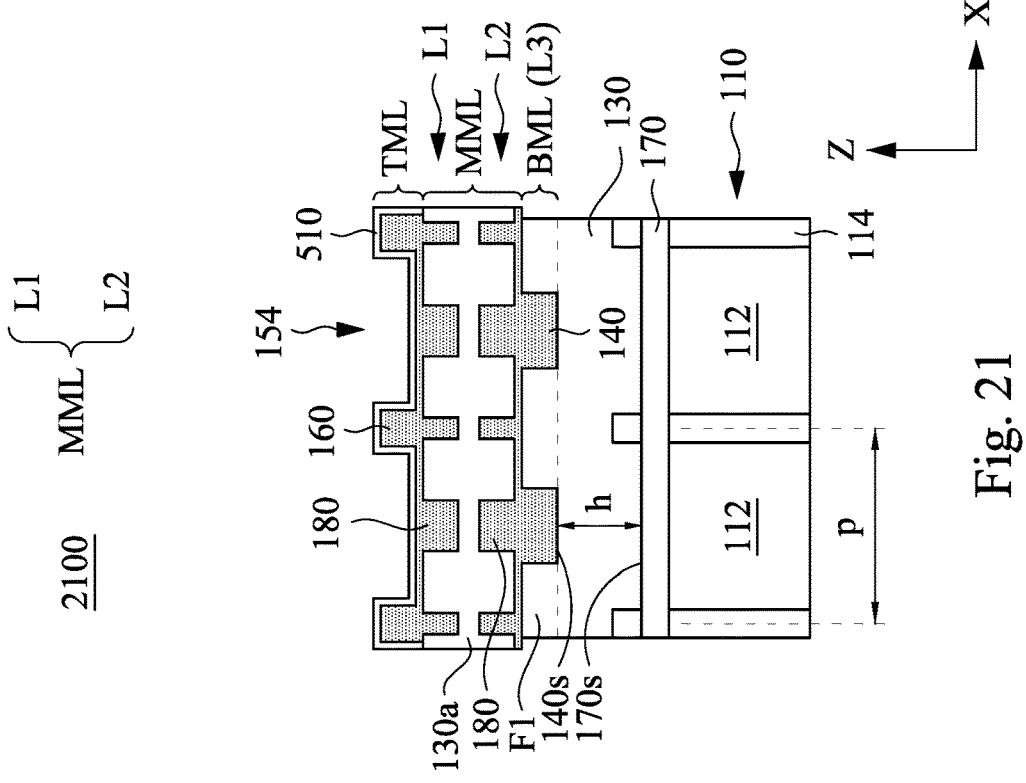
Figure 20:
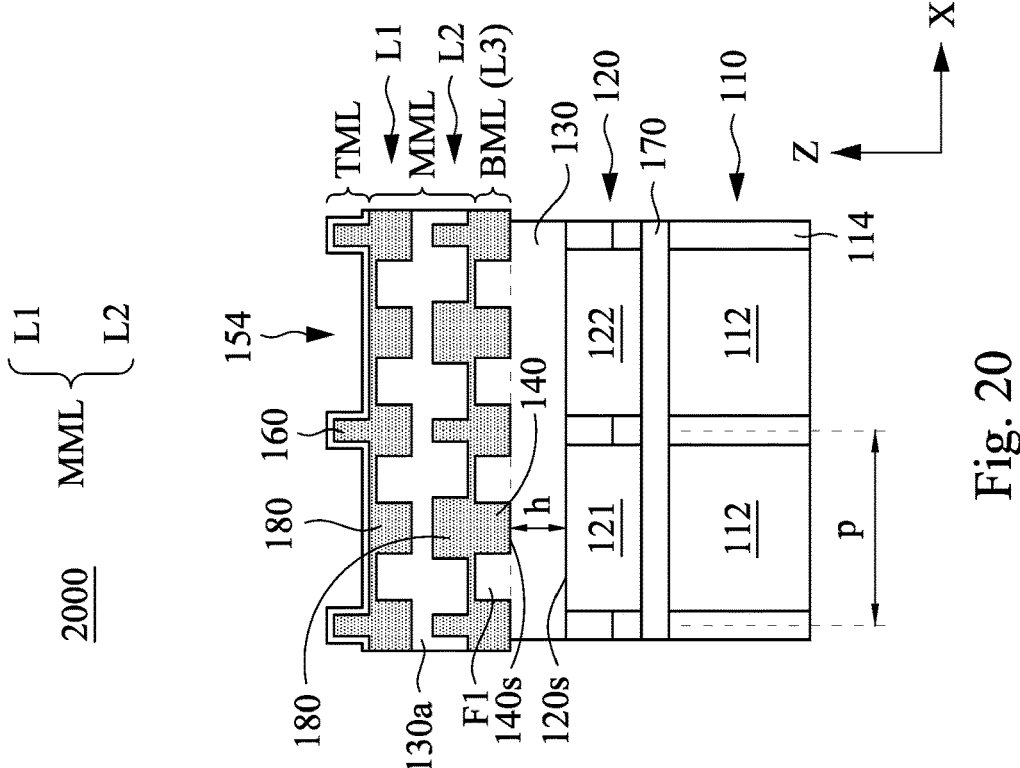

FIG. 19 to FIG. 21 are cross-sectional views of optical devices in accordance with some embodiments of the present disclosure.

Figure 6:
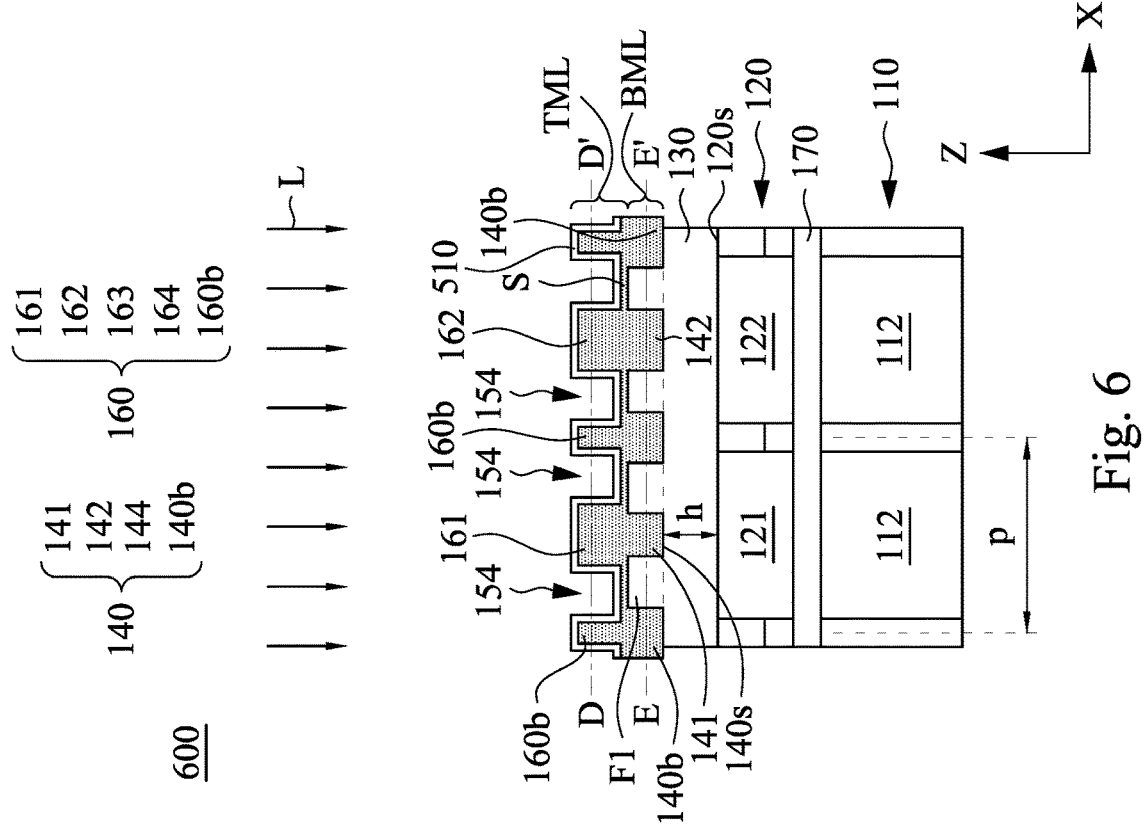
FIG. 6 is a cross-sectional view of an optical device in accordance with one embodiment of the present disclosure.

FIG. 22A to FIG. 22G are cross-sectional views of various stages of manufacturing the optical device of FIG. 6.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the field of CIS, the arrangements and dimensions of elements in an optical device would affect the focal length of light, and so affects the thickness and performance of the optical device. The present disclosure provides multilayer meta-surfaces with hybrid dielectric environment stacked on CIS to shorten the focal length of light. The disclosed optical device could reduce the focal length of light by tuning the phase difference. The phase difference is tuned by different materials with different refractive indexes. After the light transmits through different materials (hybrid dielectric environments) with different refractive indexes, the energy of light tends to focus on a smaller distance. Therefore, the focal length of light could be reduced. As a result, a thickness of an underlying layer of the disclosed optical device could be reduced, thereby decreasing the overall dimension of the optical device and increasing the performance of the optical device.

Figure 1:
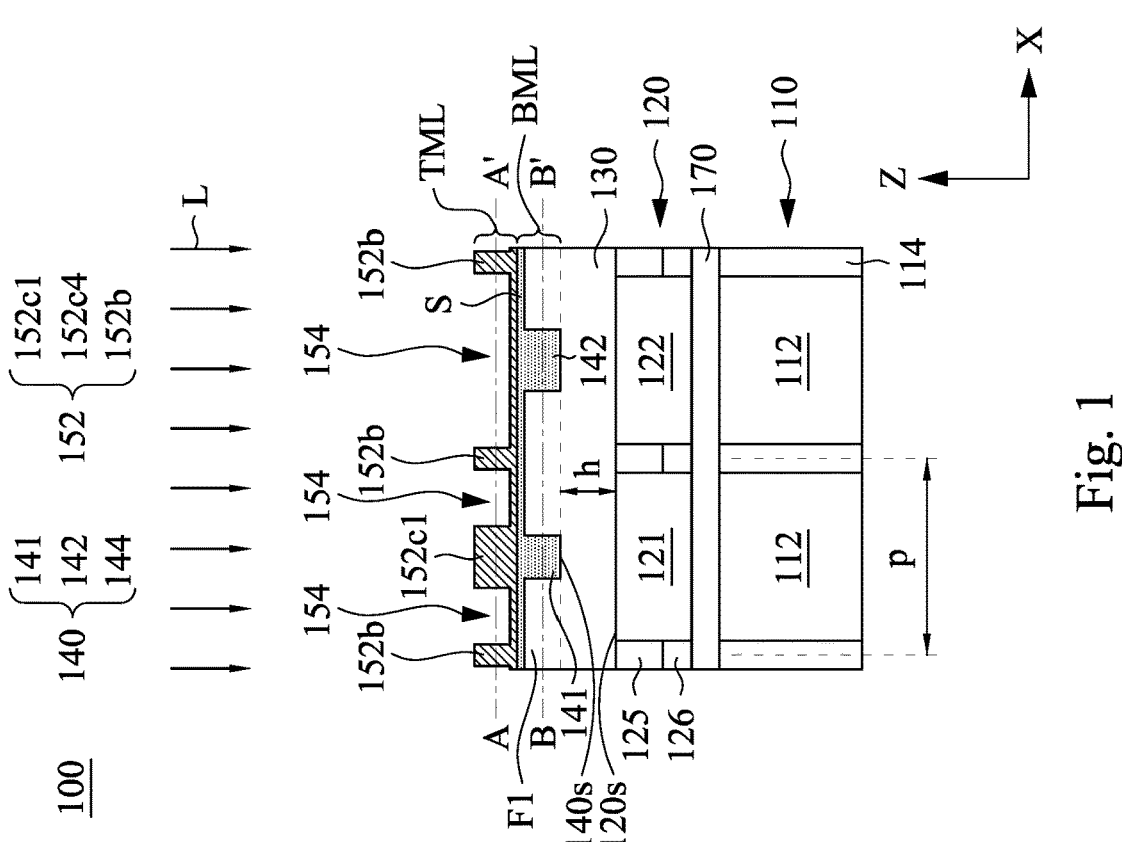
FIG. 1 is a cross-sectional view of an optical device in accordance with one embodiment of the present disclosure.

FIG. 1 is a cross-sectional view of an optical device 100 in accordance with one embodiment of the present disclosure. The optical device 100 includes a photoelectric conversion layer 110, a color filter layer 120, an underlying layer 130, a bottom meta layer BML, a top meta layer TML, and an anti-reflection layer 170. The photoelectric conversion layer 110 includes a plurality of photodiodes 112 and a plurality of deep trench isolations (DTIs) 114. The DTIs 114 separate each of the photodiodes 112. The anti-reflection layer 170 is disposed on the photoelectric conversion layer 110. The color filter layer 120 is disposed on the anti-reflection layer 170. The underlying layer 130 is disposed on the color filter layer 120. The bottom meta layer BML includes a plurality of bottom meta units 140 and a filling F1 between the bottom meta units 140. The filling F1 continuously extends from the underlying layer 130, as shown in FIG. 1. A material of the filling F1 is the same as a material of the underlying layer 130. The top meta layer TML is disposed above the bottom meta layer BML. The top meta layer TML includes a plurality of top meta units 152 and a plurality of air recesses 154, in which the plurality of air recesses 154 are respectively disposed between two adjacent top meta units 152.

In some embodiments, an effective index of the top meta layer TML is less than a refractive index of the bottom meta units 140. In some embodiments, the refractive index of the bottom meta units 140 is greater than a refractive index of the underlying layer 130. In some embodiments, a refractive index of the top meta units 152 is in a range from 1.4 to 1.7 such as 1.45, 1.5, 1.55, 1.6, or 1.65. In some embodiments, an effective index of the top meta layer TML is in a range from 1.3 to 1.6, such as 1.35, 1.4, 1.45, 1.5, or 1.55. It should be understood that the effective index herein is a mean value calculated by the refractive index of the top meta units 152 and the refractive index of the air recesses 154. In some embodiments, the refractive index of the bottom meta units 140 is in a range from 1.4 to 2.6, such as 1.8, 2, 2.2, or 2.4. In some embodiments, the refractive index of the underlying layer 130 is in a range from 1.2 to 1.8, such as, 1.3, 1.4, 1.5, 1.6, or 1.7.

As shown in FIG. 1, the color filter layer 120 is disposed between the anti-reflection layer 170 and the underlying layer 130. A pixel dimension p is determined by a distance between two adjacent DTIs 114. The pixel dimension p could be understood as a pixel length or a pixel width. A height h of the underlying layer 130 from bottom surfaces 140s of the bottom meta units 140 to a top surface 120s of the color filter layer 120 is based on the following equations:

$$h \leq ht - p$$

$$ht = \frac{np^2}{\lambda_0} - \frac{\lambda_0}{4n}$$

where ht is a theoretical height of the underlying layer 130, p is the pixel dimension, n is a refractive index of the underlying layer 130, and $\lambda_0$ is a center wavelength of a designed wavelength band of the light L passing through the top meta layer TML and the bottom meta units 140. In one embodiment, $\lambda_0$=530 nm, n=1.45, and p=0.8 μm, so the theoretical height ht would be 1.66 μm. In some embodiments of the present disclosure, the pixel dimension p is 0.8 μm and the height h is in a range from 0.25 nm to 0.6 nm.

Figure 2:
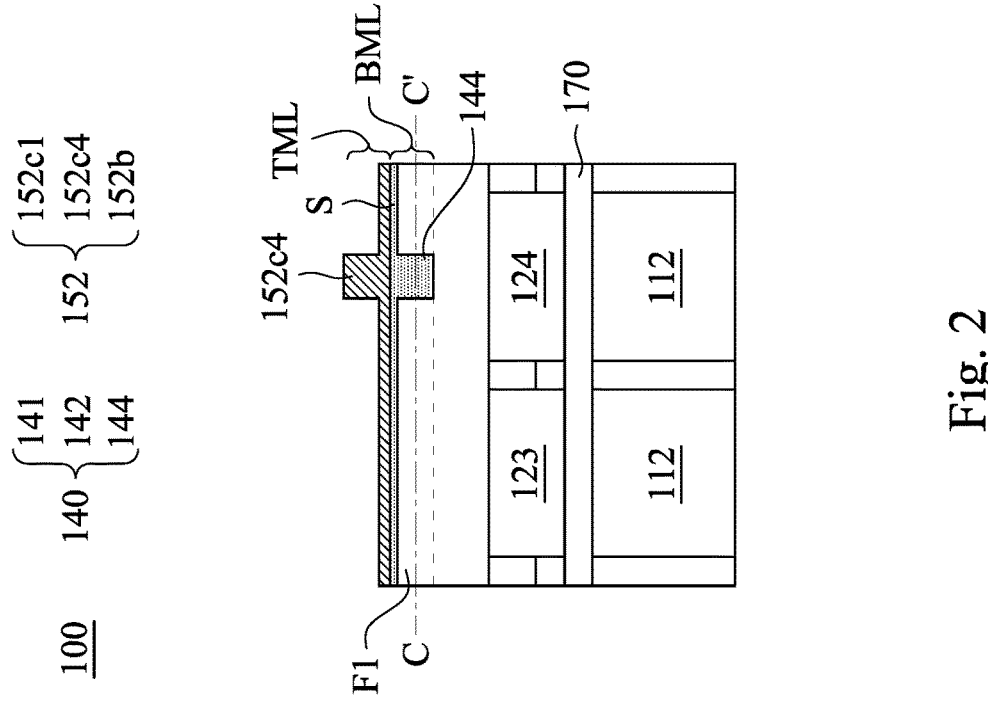
FIG. 2 is another cross-sectional view of the optical device in FIG. 1.
Figure 4:
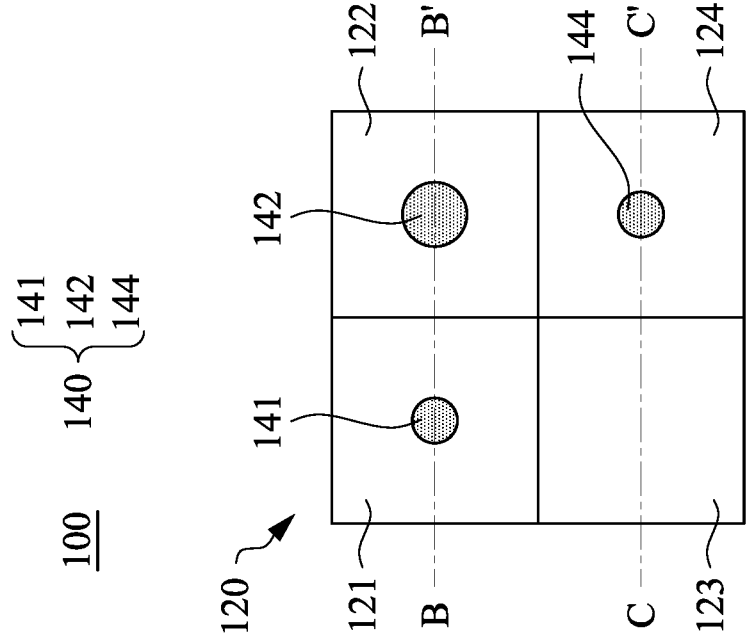
FIG. 4 is a top view of a color filter layer and bottom meta units of the optical device in FIG. 1 and FIG. 2.
Figure 3:
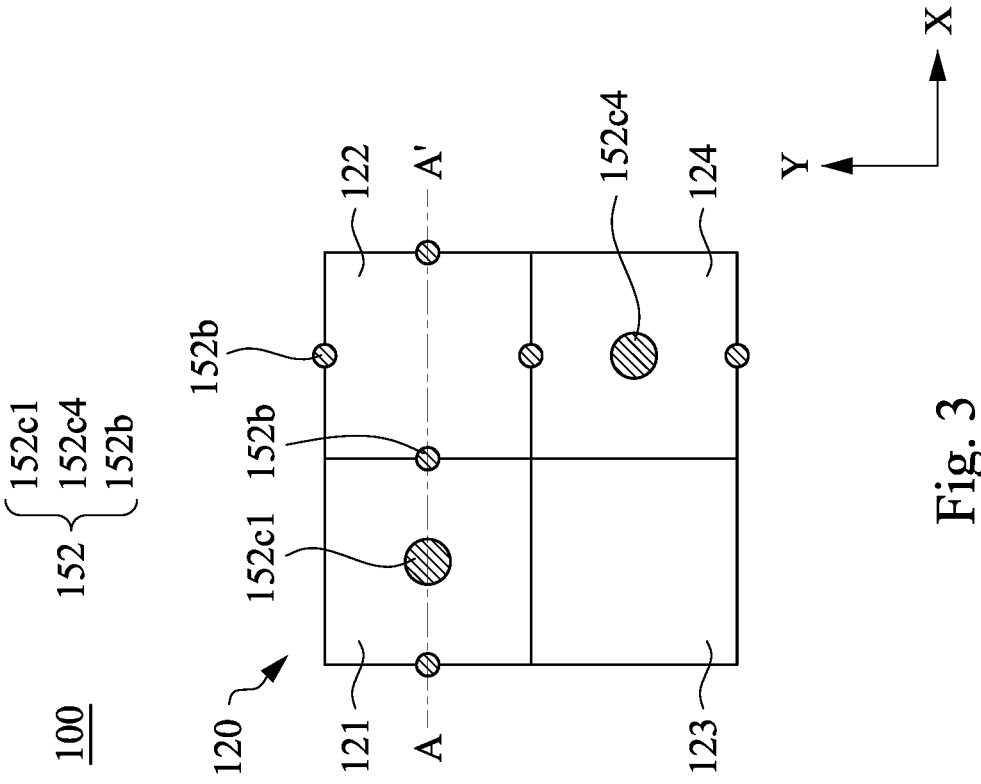
FIG. 3 is a top view of a color filter layer and a top meta layer of the optical device in FIG. 1 and FIG. 2.

FIG. 2 is another cross-sectional view of the optical device 100 in FIG. 1. FIG. 3 is a top view of the color filter layer 120 and the top meta layer TML of the optical device 100 in FIG. 1 and FIG. 2. FIG. 4 is a top view of the color filter layer 120 and the bottom meta units 140 of the optical device 100 in FIG. 1 and FIG. 2. Specifically, FIG. 3 is the top view of the top meta layer TML of the optical device 100 taken along a line A-A' in FIG. 1, in which the color filter layer 120 is shown for clarity. FIG. 4 is the top view of the bottom meta units 140 of the optical device 100 taken along a line B-B' in FIG. 1 and a line C-C' in FIG. 2, in which the color filter layer 120 is shown for clarity.

As shown in FIG. 1 to FIG. 3, the top meta units 152 include top meta units 152b, 152c1, 152c4. The top meta units 152b, 152c1, 152c4 are arranged along a direction X and a direction Y and extended along a direction Z. It is understood that the "b" in the top meta units 152b herein represents the top meta units disposed over the boundaries of color filters (such as the color filters 121~124 shown in FIG. 3). The "c" in the top meta units 152c1, 152c4 herein represents the top meta units disposed over a center of a color filter (such as the color filters 121~124 shown in FIG. 3), and the number after "152c" corresponds to the last number of the color filters 121~124. For example, as shown in FIG. 3, the top meta unit 152c1 corresponds to the color filter 121, and the top meta unit 152c2 corresponds to the color filter 124. As shown in FIG. 1, FIG. 2, and FIG. 4, the bottom meta units 140 include bottom meta units 141, 142, 144, and the number after "14" of the bottom meta units 141, 142, 144 corresponds to the last number of the color filters 121, 122, 124. The bottom meta units 141, 142, 144 are arranged along the direction X and the direction Y and extended along the direction Z.

Please refer to FIG. 1 and FIG. 3. The color filter layer 120 includes a plurality of color filters, such as color filters 121~124. Each of the color filters 121~124 is separated by isolation grids 125. Each isolation grid includes a metal grid 126, and a material of the metal grid 126 could include an absorbent material or metals, such as W, TiN, Cu or Al. The color filters 121~124 are different from each other. In some embodiments, the color filter 121 is the same as the color filter 124. In some embodiments, each of the color filters 121~124 could be a green, red, blue, white, yellow, cyan, magenta, or other pixel. In some embodiments, the color filters 121, 124 are green pixels, the color filter 122 is a red pixel, the color filter 123 is a blue pixel.

As shown in FIG. 1 and FIG. 2, each of the color filters (color filters 121~124) corresponds to one photodiode. As shown in FIG. 1 to FIG. 3, the top meta unit 152c1 corresponds to a center of the color filter 121, the top meta unit 152c4 corresponds to a center of the color filter 124, and the top meta units 152b correspond to the boundaries of the color filters 121~124. In some embodiments, some of the top meta units (such as the top meta units 152c1, 152c2, 152b) are disposed above the color filters 121, 122, 124 and free of disposed above the color filter 123, as shown in FIG. 3.

As shown in FIG. 1 and FIG. 4, the bottom meta unit 141 corresponds to a center of the color filter 121, and the bottom meta unit 142 corresponds to a center of the color filter 122. As shown in FIG. 2 and FIG. 4, the bottom meta unit 144 corresponds to a center of the color filter 124. The numbers and sizes of the top meta units 152 and the bottom meta units 140 could be adjusted to achieve the reduction of the height h of the underlying layer 130. In some embodiments, some of the bottom meta units (such as the bottom meta units 141~143) are disposed above the color filters 121, 122, 124 and free of disposed above the color filter 123, as shown in FIG. 4.

Please refer to FIG. 1 again. In some embodiments, the optical device 100 further includes an internal space layer S disposed between the top meta layer TML and the bottom meta units 140. In some embodiments, a refractive index of the internal space layer S is the same as the refractive index of the bottom meta units 140. In some embodiments, based on the manufacturing processes of the optical device 100, the refractive index of the internal space layer S is different from the refractive index of the bottom meta units 140. In some embodiments, based on the manufacturing processes of the optical device 100, the internal space layer S may be absent in the optical device 100.

Figure 5:
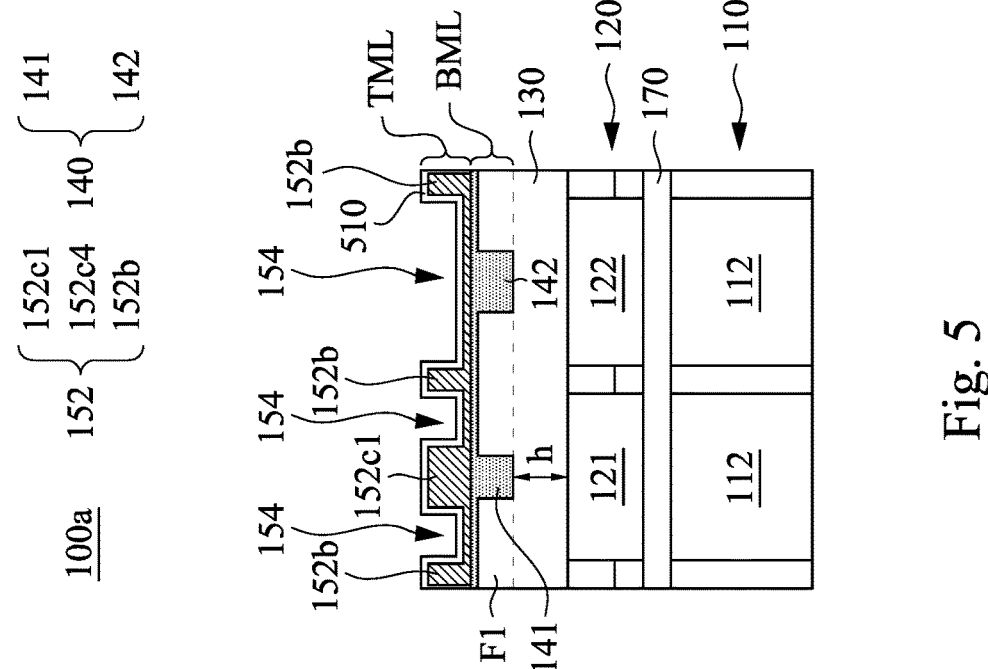
FIG. 5 is a cross-sectional view of an optical device in accordance with an alternative embodiment of the optical device in FIG. 1.

FIG. 5 is a cross-sectional view of an optical device 100a in accordance with an alternative embodiment of the optical device 100 in FIG. 1. The top meta layer TML of the optical device 100a further includes a capping layer 510. The capping layer 510 conformally and continuously lining the top meta units 152 (including top meta units 152c1, 152c4, 152b) and the air recesses 154, in which the plurality of air recesses 154 are respectively disposed between two adjacent top meta units 152. Specifically, the top meta units 152c1 is disposed between two adjacent top meta units 152b. In other words, the air recesses 154 are remained in the top meta layer. The capping layer 510 is configured to protect the top meta units 152. In some embodiments, a refractive index of the capping layer 510 is in a range from 1.4 to 1.6, such as 1.45, 1.5, or 1.55. In some embodiments, the refractive index of the top meta units 152 is different from the refractive index of the capping layer 510. In some embodiments, the top meta units 152 could be made by oxides or nitride.

Same or similar features are labeled by the same or similar numerical references, and descriptions of the same or similar features are not repeated in the following figures. It should be understood that some elements (for example, the light L) are not illustrated in the following figures for clarity.

FIG. 6 is a cross-sectional view of an optical device 600 in accordance with one embodiment of the present disclosure. The differences between the optical device 600 of FIG. 6 and the optical device 100a of FIG. 5 are the number and arrangements of the bottom meta units 140, the top meta units 152, and top meta units 160.

Figure 8:
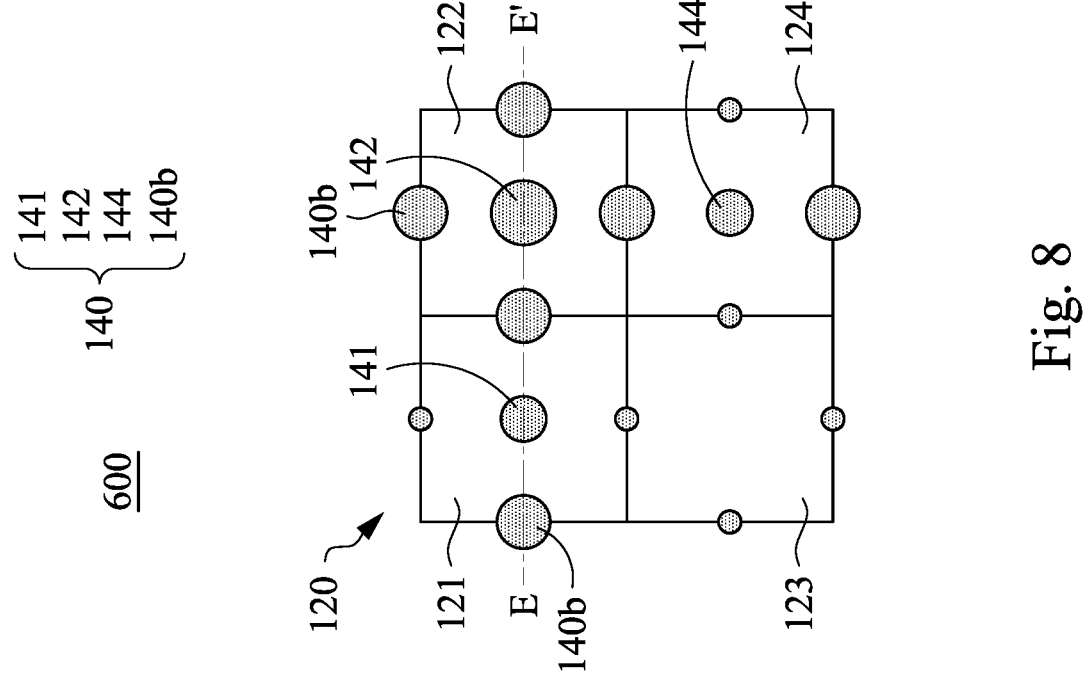
FIG. 8 is a top view of a color filter layer and bottom meta units of the optical device in FIG. 6.
Figure 7:
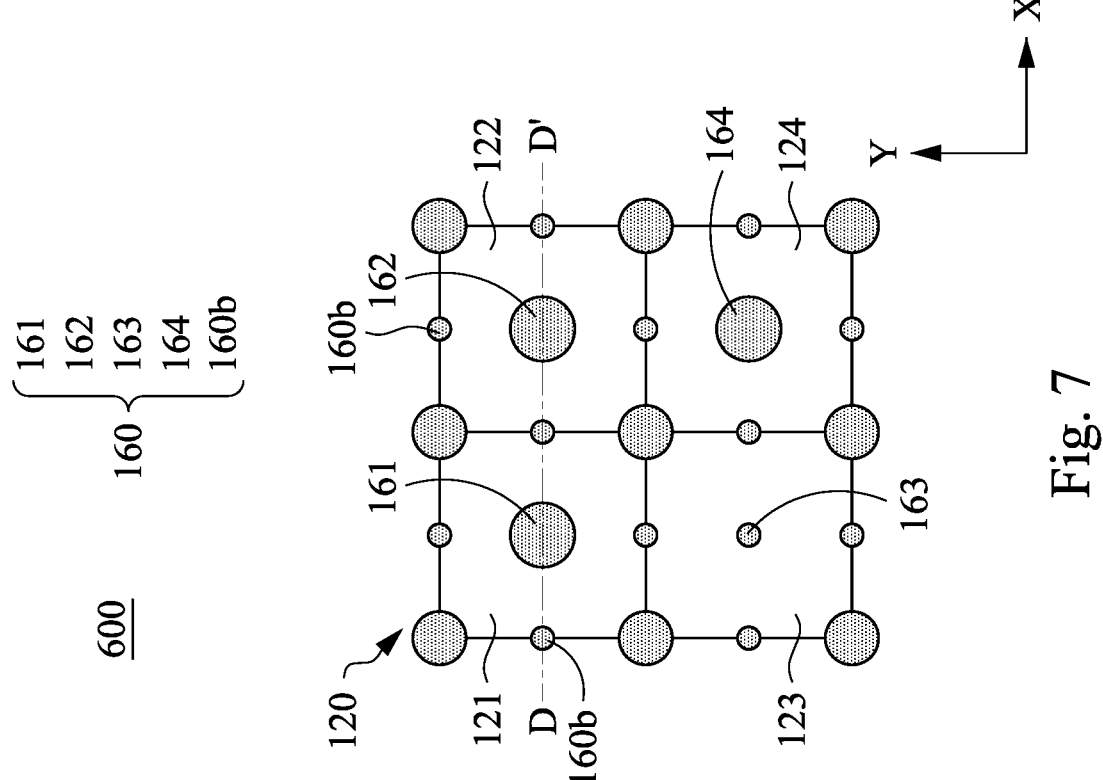
FIG. 7 is a top view of a color filter layer and top meta units of the optical device in FIG. 6.

FIG. 7 is a top view of the color filter layer 120 and the top meta units 160 of the optical device 600 in FIG. 6. FIG. 8 is a top view of the color filter layer 120 and the bottom meta units 140 of the optical device 600 in FIG. 6. Specifically, FIG. 7 is the top view of the top meta units 160 of the optical device 600 taken along a line D-D' in FIG. 6, and FIG. 8 is the top view of the bottom meta units 140 of the optical device 600 taken along a line E-E' in FIG. 6, in which the color filter layer 120 is shown for clarity.

As shown in FIG. 6 and FIG. 7, the top meta units 160 includes top meta units 161~164, 160b. It is understood that the number after "16" of the top meta units 161~164 herein corresponds to the last number of the color filters 121~124. The top meta units 161~164 are disposed above the color filters 121~124. The "b" in the top meta units 160b herein represents the top meta unit disposed over the boundaries of color filters 121~124. The top meta units 161~164, 160b are arranged along the direction X and the direction Y and extended along the direction Z.

As shown in FIG. 6 and FIG. 8, the bottom meta units 140 includes the bottom meta units 141, 142, 144, 140b. It is understood that the number after "14" of the bottom meta units 141, 142, 144 herein corresponds to the last number of the color filters 121, 122, 124. The bottom meta units 141, 142, 144 are disposed above the color filters 121, 122, 124. The "b" in the bottom meta units 140b herein represents the bottom meta units disposed over boundaries of color filters 121~124. As shown in FIG. 8, some of the bottom meta units (such as the bottom meta units 141, 142, 144) are disposed above the color filters 121, 122, 124 and free of disposed above the color filter 123.

As shown in FIG. 6, the optical device 600 includes the top meta units 160 disposed above the bottom meta units 140, in which the capping layer 510 is conformally and continuously lining the top meta units 160 (including the the top meta units 161, 162, 160b). Specifically, the capping layer 510 covers the top surfaces and the sidewalls of the top meta units 160. The internal space layer S is continuously disposed between the bottom meta units 141, 142, 140b and the top meta units 161, 162, 160b, as shown in FIG. 6. The air recesses 154 are respectively disposed between two adjacent top meta units 160. Specifically, the top meta units 161 is disposed between two adjacent top meta units 160b, and the top meta units 162 is disposed between two adjacent top meta units 160b. Please refer to FIG. 6 to FIG. 8. A symmetry axis of the color filter 121 is aligned with a symmetry axis of the bottom meta unit 141 and a symmetry axis of the top meta unit 161. It should be understood that the air recesses 154 with any at least one of the top meta units 160 or the capping layer 510 could be referred to as a "hybrid dielectric environment." In the embodiments of FIG. 6, the top meta layer TML is the combinations of the internal space layer S, the top meta units 160, the capping layer 510, and the air recesses 154. The bottom meta layer BML is the combinations of the bottom meta units 140 and the filling F1.

In some embodiments, a refractive index of the top meta units 160 is in a range from 1.4 to 2.6, such as 1.8, 2, 2.2, or 2.4. In some embodiments, the refractive index of the bottom meta units 140 is the same as the refractive index of the top meta units 160. In some embodiments, the top meta units 160 and/or the bottom meta units 140 could be made by $Al_2O_3$, $SiO_2$, $TiO_2$, $Ta_2O_5$, SiN, transparent organic material, or combinations thereof. In some embodiments, a width of each of the bottom meta units 140 is in a range from 70 nm to 500 nm, such as 100, 200, 300, or 400 nm. In some embodiments, a width of each of the top meta units 160 is in a range from 70 nm to 500 nm, such as 100, 200, 300, or 400 nm. In some embodiments, the width of each of the bottom meta units 140 may be greater, the same, or less than the width of each of the top meta units 160. In some embodiments, a height of each of the bottom meta units 140 is in a range from 50 nm to 500 nm, such as 100, 200, 300, or 400 nm. In some embodiments, a height of each of the top meta units 160 is in a range from 50 nm to 500 nm, such as 100, 200, 300, or 400 nm. In some embodiments, a height of the internal space layer S is in a range from 0 to 500 nm, such as 50, 100, 200, 300, or 400 nm. In some embodiments, a thickness of the capping layer 510 (shown in FIG. 5, and FIG. 6) is in a range from 20 nm to 150 nm, such as 50, 80, 100, 120, or 140 nm.

Please refer to FIG. 6. The top meta layer TML, the top meta units 160, and the bottom meta units 140 have a function as a phase adjusting layer. The top meta layer TML has a light-receiving surface from a light L. The light L passes through the top meta layer TML (including the capping layer 510, the air recesses 154, and the top meta units 160) and the bottom meta layer BML (including the bottom meta units 140 and the filling F1), thereby gradually tuning the phase difference. Specifically, since the refractive indexes of the air (i.e. the air recess 154), the capping layer 510, the top meta unit 160, the bottom meta units 140, and the underlying layer 130 are different, it could provide sufficient interfaces with different refractive indexes to tune the phase difference. In other words, the more the number of meta layers is there, the less the focal length of the light L might be there, so that the thickness (height h) of the underlying layer 130 from bottom surfaces 140s of the bottom meta units 140 to a top surface 120s of the color filter layer 120 (or a top surface 170s of the anti-reflection layer 170, as shown in FIG. 21) of the disclosed optical devices could be reduced. The gradient of Δn of each meta layer (such as the top meta layer TML, the middle meta layer as discussed below, and the bottom meta layer BML) could effectively vary the phase more smoothly, and eventually short the focal length. Δn is defined by $|n_{environment}-n_{metal}|$, and the $n_{environment}$ could be an effective index. For example, a hybrid dielectric environment is composed of the air recesses 154 and the capping layer 510, and the effective index of the hybrid dielectric environment is between 1 and the refractive index of the top meta units (i.e. the top meta units 160 shown in FIG. 6 or the top meta unit 152 shown in FIG. 5).

Please refer to FIG. 6, in the embodiments having the top meta units 160, when calculating the height h of the underlying layer 130, $\lambda_0$ is a center wavelength of a designed wavelength band of the light L passing through the top meta layer TML and the bottom meta layer BML.

FIG. 9 is a cross-sectional view of an optical device 900 in accordance with one embodiment of the present disclosure. The differences between the optical device 900 of FIG. 9 and the optical device 600 of FIG. 6 is the arrangements of the bottom meta units 140. FIG. 10 is a top view of the color filter layer 120 and the bottom meta units 140 of the optical device 900 in FIG. 9. Specifically, FIG. 10 is the top view of the bottom meta units 140 of the optical device 900 taken along a line F-F' in FIG. 9, in which the color filter layer 120 is shown for clarity.

More specifically, the bottom meta unit 142 in FIG. 6 is replaced by a bottom meta unit 142A in FIG. 9, and a size of the bottom meta unit 142A is greater than a size of the bottom meta unit 142. The bottom meta units 140b in FIG. 6 are replaced by the bottom meta units 140bf in FIG. 9. It is understood that the "f" in the bottom meta units 140bf herein represents "offset." As shown in FIG. 9, a symmetry axis of the color filter 122 is aligned with a symmetry axis of the bottom meta unit 142A. As shown in FIG. 9 and FIG. 10, each of the bottom meta units 140bf is disposed above boundaries between each of the color filters 121, 122, 124 and offsets a distance D. More specifically, based on a center of the bottom meta unit 142A, each of the bottom meta units 140bf in the direction X and the direction Y offsets the same distance D if the incident light is at normal direction, as shown in FIG. 10. The embodiment of FIG. 10 could be referred to as an "inner shift", and the inner shift includes an "negative shift" and a "positive shift." It is understood that the negative shift is named relative to the positive shift. For example, one of the bottom meta units 140bf is shifted to the left, and one of the other bottom meta units 140bf is shifted to the right. Also, one of the bottom meta units 140bf is shifted upwards, and one of the other bottom meta units 140bf is shifted downwards.

FIG. 11 is a cross-sectional view of an optical device 1100 in accordance with one embodiment of the present disclosure. The differences between the optical device 1100 of FIG. 11 and the optical device 600 of FIG. 6 includes the number of the bottom meta units 140. FIG. 12 is a top view of the color filter layer 120 and the top meta units 160 of the optical device 1100 in FIG. 11. FIG. 13 is a top view of the color filter layer 120 and the bottom meta units 140 of the optical device in FIG. 11. Specifically, FIG. 12 is the top view of the top meta units 160 of the optical device 1100 taken along a line G-G' in FIG. 11, and FIG. 13 is the top view of the bottom meta units 140 of the optical device 1100 taken along a line H-H' in FIG. 11, in which the color filter layer 120 is shown for clarity.

It is understood that the numbers and sizes of the top meta units 160 and the bottom meta units 140 could be adjusted according to the requirements of the optical devices to achieve the reduction of the height h of the underlying layer 130. As shown in FIG. 11, the sizes of the top meta units 160 are the same as the sizes of the bottom meta units 140.

As shown in FIG. 12, some of the top meta units (such as the top meta units 161, 162, 164, 160b) are disposed above the color filters 121, 122, 124 and free of disposed above the color filter 123. As shown in FIG. 13, the bottom meta units 141~144 are respectively disposed above the color filters 121~124.

FIG. 14A is a cross-sectional view of an optical device 1400 in accordance with one embodiment of the present disclosure. All of the photoelectric conversion layer 110, the color filter layer 120, the bottom meta layer BML, and the top meta layer TML are shifted. It is understood that it could be referred to as a "global shift" when one layer relative to another layer are shifted. Therefore, the symmetry axes of the photodiode 112 under the color filter 121, the color filter 121, the bottom meta unit 141, and the top meta unit 161 are misaligned with each other. Similarly, the symmetry axis of the bottom meta units 142 is misaligned with the symmetry axis of the top meta units 162. In some alternative embodiments, each of the bottom meta units 140 of the bottom meta layer BML may have additional shift. Similarly, each of the top meta units 160 of the top meta layer TML also may have additional shift, please refer to the description of FIG. 14B below.

FIG. 14B is a top view of the color filter layer 120 and the top meta units 160 in accordance with an alternative embodiment of the optical device 1400 in FIG. 14A. The midlines Mb1, Mb2, Mb3 in FIG. 14A and FIG. 14B respectively represent the midlines of the top meta units 160b1, 160b2, 160b3 in FIG. 14A. The midlines M1, M2 in FIG. 14A and FIG. 14B respectively represent the midlines of the top meta units 161, 162 in FIG. 14A. As shown in FIG.

14B, each of the top meta units 161, 162, 164, 160*b* offsets different amount of distance. Specifically, the top meta units 160*b*1 has an offset distance d1, the top meta units 161 has an offset distance d2, the top meta units 160*b*2 does not shift, the top meta units 162 has an offset distance d3, and the top meta units 160*b*3 has an offset distance d3.

The offset distances d1~d4 may be the same or different from each other. Since the shift of the top meta units 160 in FIG. 14B is in the top meta layer TML, the embodiment of FIG. 14B could be referred to as an "inner shift." More specifically, the top meta units 160*b*1 could be referred to as a "negative shift," and each of the top meta units 161, 162, 160*b*3 could be referred to as a "positive shift."

FIG. 15 is a cross-sectional view of an optical device 1500 in accordance with one embodiment of the present disclosure. FIG. 16 is a top view of the color filter layer 120 of the optical device 1500 in FIG. 15. The differences between the optical device 1500 of FIG. 15 and the optical device 600 of FIG. 6 are the number of the photodiodes 112. Specifically, each of the color filters 121~144 correspond to quad photodiodes 112 (QPD), as shown in FIG. 16. The pixel dimension p (including a pixel length or a pixel width) is also determined by a distance between two adjacent DTIs 114. In the embodiment of the optical device 1500, the height h of the underlying layer 130 from bottom surfaces 140*s* of the bottom meta units 140 to a top surface 120*s* of the color filter layer 120 is based on the following equations:

$$h \leq ht - 2p$$

$$ht = \frac{4np^2}{\lambda_0} - \frac{\lambda_0}{4n}$$

where ht is a theoretical height of the underlying layer 130, p is the pixel dimension, n is a refractive index of the underlying layer 130, and $\lambda_0$ is a center wavelength of a designed wavelength band of the light L passing through the top meta layer TML, the top meta units 160, and the bottom meta layer BML.

Please refer to FIGS. 6, 9, 11, 14A, 15 again. The bottom meta units 140 in the optical devices 600, 900, 1100, 1400, 1500 are arranged along the direction X and in one layer, and the bottom meta units 140 connect to the top meta units 160.

FIG. 17A and FIG. 17B are cross-sectional views of optical devices 1700A, 1700B in accordance with some embodiments of the present disclosure. The photoelectric conversion layer 110 further includes a plurality of inner deep trench isolations (DTIs) 113 to separate the pixel with dual photodiode (DPD) 112. The differences between optical device 1700A of FIG. 17A and the optical device 600 of FIG. 6 are the inner DTIs 113 and the number of the photodiodes 112. The differences between the optical device 1700A of FIG. 17A and the optical device 1700B of FIG. 17B are the inner DTIs 113. As shown in FIG. 17A, the photodiodes 112 are spaced apart by the inner DTIs 113 and the DTIs 114. It is noticed that each of the inner DTIs 113 is disposed between two adjacent DTIs 114; therefore, the DTIs 114 also could be understood as "outer DTIs 114." As shown in FIG. 17B, there is no inner DTI 113 disposed between outer DTIs 114, and dual photodiodes 112 are disposed in two adjacent outer DTIs 114.

FIG. 17C is a top view of the color filter layers 120 of the optical devices 1700A, 1700B in FIG. 17A and FIG. 17B, in which the photodiodes 112 are shown. Specifically, each of the color filters 121~144 correspond to dual photodiodes 112

(DPD), in which the pixel dimension p (including a pixel length or a pixel width) is determined by a distance between two adjacent outer DTIs 114.

FIG. 18A and FIG. 18B are cross-sectional views of optical devices 1800A, 1800B in accordance with some embodiments of the present disclosure. Specifically, the differences between the optical device 1700A of FIG. 17A and the optical device 1800A of FIG. 18A are the arrangements of the photodiodes 112 below the color filter 121. Similarity, the differences between the optical device 1700B of FIG. 17B and the optical device 1800B of FIG. 18B also are the arrangements of the photodiodes 112 below the color filter 121.

FIG. 18C is a top view of the color filter layers 120 of the optical devices 1800A, 1800B in FIG. 18A and FIG. 18B, in which the photodiodes 112 are shown. The differences between the FIG. 17C and FIG. 18C are the arrangements of the photodiodes 112 below the color filter 121. Specifically, as shown in FIG. 17C, all of the photodiodes 112 below the color filters 121, 122, 123, 124 extend along the direction Y and arrange along the direction X. As shown in FIG. 18C, the photodiodes 112 below the color filter 121 extend along the direction X and arranges along the direction Y, and the photodiodes 112 below the color filters 122, 123, 124 extend along the direction Y and arrange along the direction X. In FIG. 18C, it is understood that each of the color filters 121~124 also correspond to dual photodiodes 112 (DPD), in which the pixel dimension p (including a pixel length or a pixel width) is determined by a distance between two adjacent outer DTIs 114.

In the embodiment of FIG. 17A to FIG. 17C and the embodiments of FIG. 18A to FIG. 18C, the height h of the underlying layer 130 from the bottom surfaces 140*s* of the bottom meta units 140 to a top surface 120*s* of the color filter layer 120 is based on the following equations:

$$h \leq ht - p$$

$$ht = \frac{np^2}{\lambda_0} - \frac{\lambda_0}{4n}$$

where ht is a theoretical height of the underlying layer 130, p is the pixel dimension, n is a refractive index of the underlying layer 130, and $\lambda_0$ is a center wavelength of a designed wavelength band of the light L passing through the top meta layer TML and the bottom meta units 140.

FIG. 19 is a cross-sectional view of an optical device 1900 in accordance with some embodiments of the present disclosure. The differences between the optical device 1900 of FIG. 19 and the optical device 600 of FIG. 6 includes the number of meta layers, including the top meta layer TML, a middle meta layer MML, and the bottom meta layer BML. The middle meta layer MML is disposed between the top meta layer TML and the bottom meta layer BML. The middle meta layer MML includes a plurality of middle meta units 180, and the material of the middle meta units 180 is the same as the material of the top meta units 160 and/or the bottom meta units 140. Specifically, the air recesses 154 are disposed above the middle meta units 180. The patterns (arrangements) of the bottom meta units 140, the middle meta units 180, and the top meta units 160 may be the same or different.

FIG. 20 is a cross-sectional view of an optical device 2000 in accordance with some embodiments of the present disclosure. The optical device 2000 includes the top meta layer TML, the middle meta layer MML, and the bottom meta layer BML. The middle meta layer MML includes the middle meta units 180 and arranges in a first layer L1 and a second layer L2. The middle meta units 180 in the optical device 2000 are arranged along the direction X. In such embodiment, the bottom meta layer BML could be referred to as a third layer L3. As shown in FIG. 20, the first layer L1 (the middle meta units 180) connects to the top meta units 160, the second layer L2 (the middle meta units 180) connects to the third layer L3 (i.e. the bottom meta layer BML), and the first layer L1 and the second layer L2 are spaced by the underlying layer 130. In the embodiment of FIG. 20, an underlying layer 130a is disposed between the first layer L1 and the second layer L2. The material of the underlying layer 130a is the same as the material of the underlying layer 130. The material of the middle meta units 180 is the same as the material of the top meta units 160 and/or the bottom meta units 140. The patterns (arrangements) of the bottom meta units 140, the middle meta units 180, and the top meta units 160 may be the same or different.

FIG. 21 is a cross-sectional view of an optical device 2100 in accordance with some embodiments of the present disclosure. The optical device 2100 od FIG. 21 is similar to the optical device 2000 of FIG. 20, but the patterns (arrangements) of the different meta units are different. Specifically, the pattern of the bottom meta units 140 in FIG. 20 is different from that of FIG. 21, the pattern of the middle meta units 180 in FIG. 20 is different from that of FIG. 21, and the pattern of the top meta units 160 in FIG. 20 is different from that of FIG. 21. In addition, as shown in FIG. 21, the optical device 2100 is free of the color filter layer 120. In such embodiment, the height h of the underlying layer 130 from bottom surfaces 140s of the third layer L3 (the bottom meta units 140) to a top surface 170s of the anti-reflection layer 170 is based on the equations mentioned above, where the pixel dimension p is determined by a distance between two adjacent DTIs 114. It is understood that despite the fact that the optical device 2100 shown in FIG. 21 is one photodiode 112 corresponding to one color filter (the color filter 121, 122), quad photodiodes 112 (QPD) are also applied in other embodiments (i.e. quad photodiodes 112 correspond to one color filter, as shown in FIG. 15). The numbers and sizes of each of the layers (i.e. the first layer L1, the second layer L2, and the third layer L3) of the optical device 2000 in FIG. 20 and the optical device 2100 in FIG. 21 could be adjusted to achieve the reduction of the height h of the underlying layer 130.

FIG. 22A to FIG. 22G are cross-sectional views of various stages of manufacturing the optical device 600 of FIG. 6. It is understood that additional operations can be provided before, during, and after processes shown by FIG. 22A to FIG. 22G, and some of the operations described below can be replaced or eliminated, for additional embodiments of the process. The order of the operations/processes may be interchangeable.

Figure 22B:
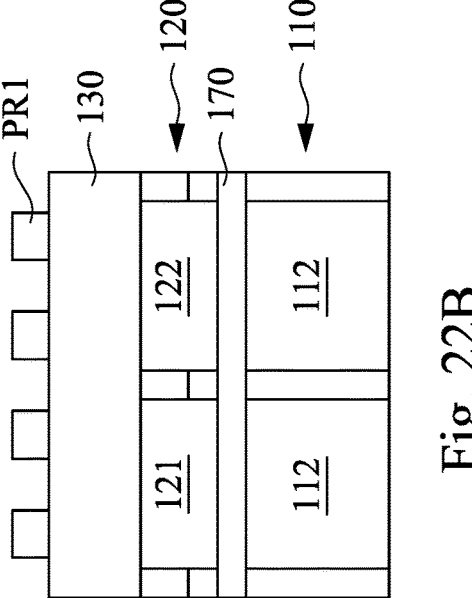
Figure 22D:
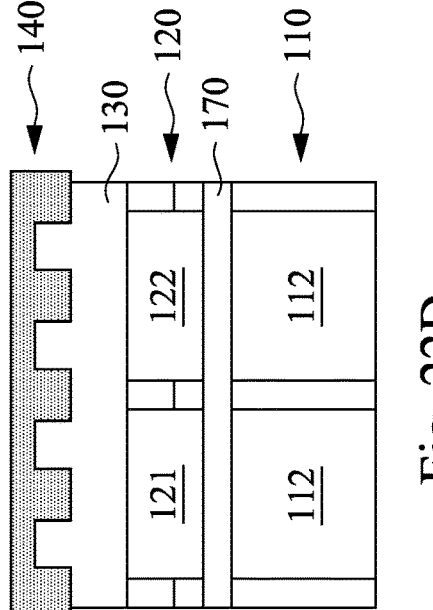
Figure 22A:
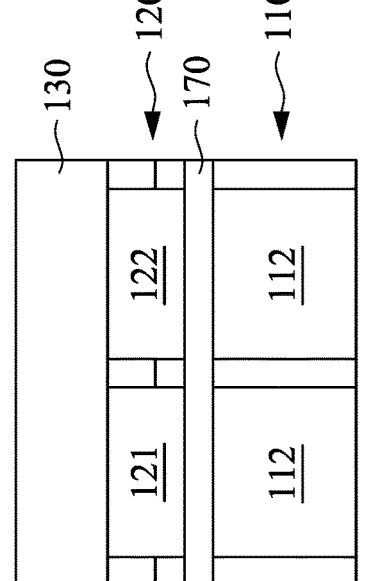
Figure 22C:
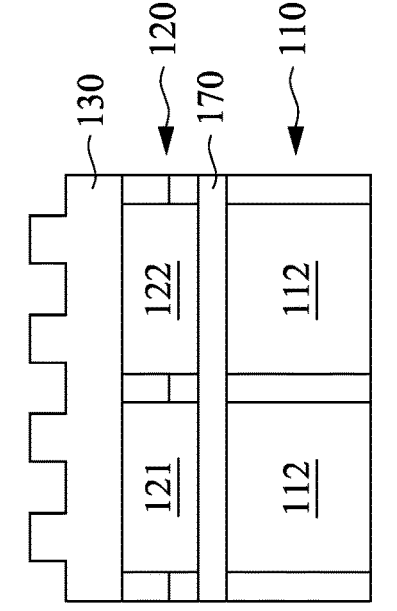

As shown in FIG. 22A, a stack device with the photoelectric conversion layer 110, the anti-reflection layer 170, the color filter layer 120, and a material layer of the underlying layer 130 is provided. As shown in FIG. 22A and FIG. 22B, a patterned photoresist mask PR1 with a plurality of openings is formed on the underlying layer 130. As shown in FIG. 22B and FIG. 22C, an etching process is performed by the patterned photoresist mask PR1 to form the underlying layer 130 with a pattern having a plurality of openings. As shown in FIG. 22C and FIG. 22D, a material layer of the bottom meta units 140 is filled the openings of the underlying layer 130 before performing a chemical mechanical planarization process.

Figures 22E, 22F, 22G:
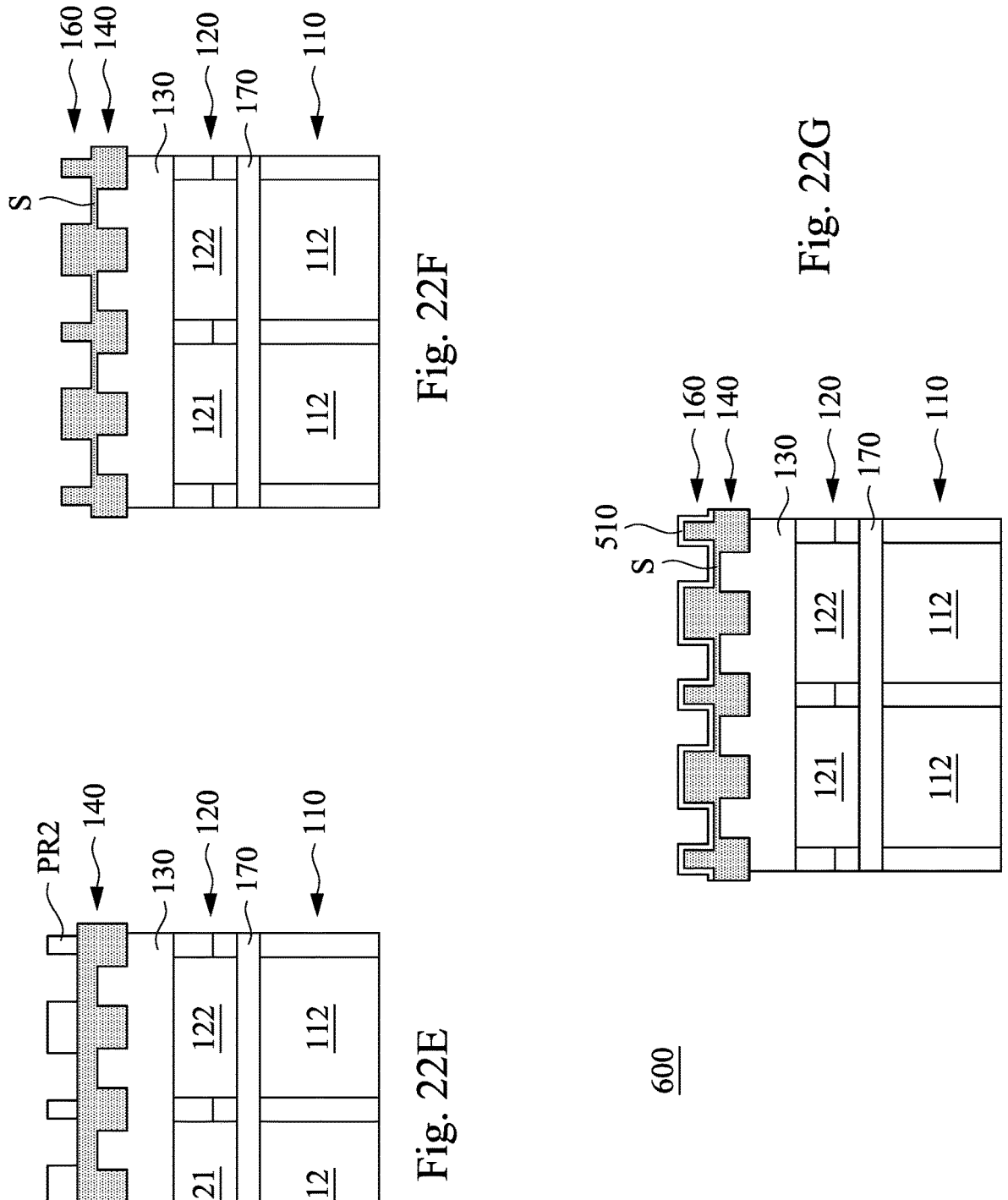

As shown in FIG. 22D and FIG. 22E, a patterned photoresist mask PR2 with a plurality of openings is formed on the underlying layer 130. As shown in FIG. 22E and FIG. 22F, an etching process is performed by the patterned photoresist mask PR2 to form the top meta units 160 with a pattern having a plurality of openings, in which the bottom meta unit 140 are embedded in the top portion of the underlying layer 130 and the internal space layer S remains on the bottom meta unit 140. In the embodiment that the internal space layer S is remained, portions of top surfaces of the internal space layer S are exposed. In other embodiments, the internal space layer S does not remained on the bottom meta unit 140 in the etching process from FIG. 22E to FIG. 22F, so that portions of top surfaces of the underlying layer 130 are exposed. As shown in FIG. 22F and FIG. 22G, the capping layer 510 is formed on top surfaces and sidewalls of the top meta units 160 and on the exposed top surfaces of the internal space layer S.

The present disclosure provides multilayer meta-surfaces with hybrid dielectric environment stacked on CIS to shorten the focal length of light. After the light transmits through different materials (hybrid dielectric environments) with different refractive indexes, the energy of light tends to focus on a smaller distance. Therefore, the focal length of light could be reduced. As a result, a thickness of the underlying layer of the disclosed optical devices could be reduced, thereby decreasing the overall dimension of the optical device and increasing the performance of the optical device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical device, comprising:
a photoelectric conversion layer comprising a plurality of photodiodes;
an anti-reflection layer disposed on the photoelectric conversion layer;
an underlying layer disposed above the anti-reflection layer;
a bottom meta layer disposed on the underlying layer and comprising a plurality of bottom meta units and a filling between the bottom meta units, wherein the filling continuously extends from the underlying layer, and a material of the filling is the same as a material of the underlying layer;
a top meta layer disposed above the bottom meta layer and comprising a plurality of top meta units and a plurality of air recesses, wherein the plurality of air recesses are respectively disposed between two adjacent top meta units; and an internal space layer connecting the top meta units to the bottom meta units, wherein a refractive index of the internal space layer is the same as a refractive index of the bottom meta units.

2. The optical device of claim 1, wherein an effective refractive index of the top meta layer including the plurality of top meta units and the plurality of air recesses is in a range from 1.3 to 1.6, the refractive index of the bottom meta units is in a range from 1.4 to 2.6, a refractive index of the underlying layer is in a range from 1.2 to 1.8, and the refractive index of the bottom meta units is greater than the refractive index of the underlying layer.

3. The optical device of claim 1, wherein the top meta layer has a global shift relative to the bottom meta layer, and the global shift is an offset defined by an edge of the top meta layer from a corresponding edge of the bottom meta layer.

4. The optical device of claim 1, wherein the top meta units of the top meta layer have an inner shift, and the inner shift comprises a negative shift and a positive shift, and the inner shift is an offset defined by a midline of each of the top meta units from an original midline of each of the top meta units.

5. The optical device of claim 1, wherein a symmetry axis of each of the bottom meta units is misaligned with a symmetry axis of each of the top meta units, in a cross-sectional view.

6. The optical device of claim 1, wherein the refractive index of the bottom meta units is in a range from 1.4 to 2.6, a refractive index of the top meta units is in a range from 1.4 to 2.6, and the refractive index of the bottom meta units is the same as the refractive index of the top meta units.

7. The optical device of claim 1, wherein the refractive index of the internal space layer is the same as the refractive index of the refractive index of the top meta units.

8. The optical device of claim 1, wherein the refractive index of the internal space layer is different from the refractive index of the top meta units.

9. The optical device of claim 1, wherein a width of each of the bottom meta units is in a range from 70 nm to 500 nm, a width of each of the top meta units is in a range from 70 nm to 500 nm, a height of each of the bottom meta units is in a range from 50 nm to 500 nm, a height of each of the top meta units is in a range from 50 nm to 500 nm, and a height of the internal space layer is in a range from 0 to 500 nm.

10. The optical device of claim 1, further comprising a capping layer conformally and continuously lining the plurality of top meta units, wherein the plurality of air recesses are remained in the top meta layer.

11. The optical device of claim 10, wherein a refractive index of the top meta units is in a range from 1.4 to 2.6, a refractive index of the capping layer is in a range from 1.4 to 1.6, and the refractive index of the top meta units is different from the refractive index of the capping layer.

12. The optical device of claim 1, further comprising a color filter layer disposed between the photoelectric conversion layer and the underlying layer.

13. The optical device of claim 12, wherein the color filter layer comprises a plurality of color filters and each of the color filters corresponding to quad photodiodes, and a height of the underlying layer satisfies the following equations:

$$h \le ht - 2p,$$

-continued $$\text{in which } ht = \frac{4np^2}{\lambda_0} - \frac{\lambda_0}{4n}$$

wherein h is the height of the underlying layer from bottom surfaces of the bottom meta units to a top surface of the color filter layer, ht is a theoretical height of the underlying layer, p is a pixel dimension, wherein the pixel dimension is determined by a distance between two adjacent deep trench isolations, n is a refractive index of the underlying layer, $\lambda_0$ is a center wavelength of a designed wavelength band of a light passing through the top meta layer and the bottom meta layer.

14. The optical device of claim 12, wherein the color filter layer comprises a first color filter, a second color filter, and a third color filter, wherein the plurality of bottom meta units are disposed above the first color filter, the second color filter and the third color filter, wherein the plurality of top meta units are disposed above the first color filter and the second color filter and free of disposed above the third color filter.

15. The optical device of claim 12, wherein the color filter layer comprises a first color filter and a second color filter, the photodiodes below the first color filter extend along a first direction and arranges along a second direction substantially perpendicular to the first direction, and the photodiodes below the second color filter extend along the second direction and arrange along the first direction.

16. The optical device of claim 1, wherein a height of the underlying layer satisfies the following equations:

$$h \le ht - p,$$

$$\text{in which } ht = \frac{np^2}{\lambda_0} - \frac{\lambda_0}{4n}$$

wherein h is the height of the underlying layer from bottom surfaces of the bottom meta units to a top surface of the anti-reflection layer, ht is a theoretical height of the underlying layer, p is a pixel dimension, wherein the pixel dimension is determined by a distance between two adjacent deep trench isolations, n is a refractive index of the underlying layer, $\lambda_0$ is a center wavelength of a designed wavelength band of a light passing through the top meta layer and the bottom meta layer.

17. The optical device of claim 16, further comprising a color filter layer disposed between the anti-reflection layer and the underlying layer, wherein the color filter layer comprises a plurality of color filters and each of the color filters corresponding to one or dual photodiodes, and the height of the underlying layer is from bottom surfaces of the bottom meta units to a top surface of the color filter layer.

18. The optical device of claim 17, wherein the color filter layer comprises a first color filter, a second color filter, and a third color filter, wherein the plurality of bottom meta units are disposed above the first color filter and the second color filter and free of disposed above the third color filter.

* * * * *